(12) United States Patent
Yamada et al.

(10) Patent No.: US 9,191,628 B2
(45) Date of Patent: Nov. 17, 2015

(54) PATTERN DIMENSION MEASUREMENT METHOD, PATTERN DIMENSION MEASUREMENT DEVICE, PROGRAM FOR CAUSING COMPUTER TO EXECUTE PATTERN DIMENSION MEASUREMENT METHOD, AND RECORDING MEDIUM HAVING SAME RECORDED THEREON

(75) Inventors: Shinya Yamada, Kawasaki (JP); Yuji Takagi, Kamakura (JP)

(73) Assignee: Hitachi High-Technologies Corporation, Tokyo (JP)

( * ) Notice: Subject to any disclaimer, the term of this patent is extended or adjusted under 35 U.S.C. 154(b) by 539 days.

(21) Appl. No.: 13/699,167

(22) PCT Filed: May 18, 2011

(86) PCT No.: PCT/JP2011/002748
§ 371 (c)(1),
(2), (4) Date: Jan. 29, 2013

(87) PCT Pub. No.: WO2011/145338
PCT Pub. Date: Nov. 24, 2011

(65) Prior Publication Data
US 2013/0120551 A1 May 16, 2013

(30) Foreign Application Priority Data
May 21, 2010 (JP) .................................. 2010-116901

(51) Int. Cl.
*G06K 9/00* (2006.01)
*H04N 7/18* (2006.01)
*H01J 37/244* (2006.01)
(Continued)

(52) U.S. Cl.
CPC ................ *H04N 7/18* (2013.01); *H01J 37/244* (2013.01); *H01J 37/28* (2013.01); *G01B 2210/56* (2013.01); *H01J 2237/221* (2013.01); *H01J 2237/24578* (2013.01)

(58) Field of Classification Search
USPC ......... 382/100, 103, 106, 108, 123, 141, 144, 382/146–150, 154, 162, 168, 173, 181, 193, 382/199, 209, 219, 232, 254, 274–276, 312, 382/286, 145; 250/310; 702/159
See application file for complete search history.

(56) References Cited

U.S. PATENT DOCUMENTS

| 6,480,807 | B1 | 11/2002 | Miyano | |
| 6,480,808 | B1* | 11/2002 | Early | G06F 17/18 702/179 |
| 2002/0181776 | A1* | 12/2002 | Ikku | G06T 7/0083 382/199 |

(Continued)

FOREIGN PATENT DOCUMENTS

| JP | 58-117405 A | 7/1983 |
| JP | 61-278708 A | 12/1986 |

(Continued)

OTHER PUBLICATIONS

Corresponding International Search Report with English Translation dated Jun. 28, 2011 (six (6) pages).

*Primary Examiner* — Seyed Azarian
(74) *Attorney, Agent, or Firm* — Crowell & Moring LLP

(57) ABSTRACT

A technique for calculating the angle from an auxiliary dot sequence indicating the track of a pattern and for performing pattern measurement is provided, thereby enabling achievement of high-accuracy pattern measurement with reduced influence of the roughness of pattern edges.

17 Claims, 19 Drawing Sheets

(51) Int. Cl.
*H01J 37/28* (2006.01)
*G01N 23/00* (2006.01)

(56) References Cited

U.S. PATENT DOCUMENTS

| | | |
|---|---|---|
| 2005/0121610 A1 | 6/2005 | Abe |
| 2005/0207673 A1* | 9/2005 | Takane ............... G01B 15/04 382/286 |
| 2009/0218491 A1* | 9/2009 | Morokuma ........... G01B 15/04 250/310 |
| 2009/0263024 A1* | 10/2009 | Yamaguchi .......... G06T 7/0006 382/199 |

FOREIGN PATENT DOCUMENTS

| | | |
|---|---|---|
| JP | 1-112649 A | 5/1989 |
| JP | 10-222680 A | 8/1998 |
| JP | 2005-116795 A | 4/2005 |
| JP | 2005-195361 A | 7/2005 |
| JP | 4040809 B2 | 1/2008 |
| WO | WO 2007/094439 A1 | 8/2007 |

* cited by examiner

AUXILIARY DOT SEQUENCE 501 INDICATES TRACK

600

APPROXIMATE STRAIGHT LINE 601

PATTERN DIMENSION MEASUREMENT METHOD, PATTERN DIMENSION MEASUREMENT DEVICE, PROGRAM FOR CAUSING COMPUTER TO EXECUTE PATTERN DIMENSION MEASUREMENT METHOD, AND RECORDING MEDIUM HAVING SAME RECORDED THEREON

TECHNICAL FIELD

The present invention is in the field of dimension measurement of patterns on semiconductor wafers and, more particularly, relates to a method and apparatus for measuring dimensions of a pattern having inclination with respect to an image.

BACKGROUND ART

In semiconductor pattern dimension measurement, a high-resolution image sensed by a scanning electron microscope (SEM) is used to obtain coordinates of pattern edges on an image; then, dimensions are calculated from edge coordinates of both ends thereof. If the pattern is a straight line and simultaneously is in parallel with the vertical direction or horizontal direction of a display image, it is possible to readily obtain the pattern dimensions from a difference of coordinate values in the horizontal or vertical direction of both edges. However, there is an exemplary case where special shape patterns having curved line portions are employed for the purpose of achieving higher density of semiconductor circuits. In these patterns, a direction indicating the shortest distance between edges to be regarded as a size value tends to vary continuously; so, mere use of the above-noted prior known method does not enable achievement of accurate dimension measurement. In addition, even where the pattern is a straight line, when the pattern is a pattern extending in a direction inclined with respect to the display image, it is similarly difficult to perform accurate dimension measurement.

It is noted here that Patent Literature 1 discloses therein a technique for performing measurement of a pattern inclined with respect to a display image; more specifically, a scheme for acquiring, based on a figure reflecting the shape of a very small or fine pattern, a signal waveform in a direction perpendicular to a tangent line of the contour of a graphic form and for detecting pattern edge coordinates to thereby measure the pattern shape.

CITATION LIST

Patent Literature

Patent Literature 1: U.S. Pat. No. 4,040,809

SUMMARY OF INVENTION

Technical Problem

In order to measure, with high accuracy, size values of a pattern inclined relative to an image even in the case of a straight line or a pattern having a curved line portion(s) in a measurement object region, it is necessary to perform measurement by fully taking account of an angle formed by a local track or trajectory at an inclined or curved pattern portion and the vertical direction or horizontal direction of the image, while at the same time suppressing the influence of edge roughness.

Although Patent Literature 1 discloses therein a proposed way of handling the region and boundary length of a pattern as measurement objects, which includes the steps of preparing a graphic form reflecting the shape of the pattern, acquiring a signal waveform in a direction perpendicular to the inclination of an edge line of such graphic form and analyzing the same, it fails to disclose any teachings regarding the measurement of dimensions of such pattern; furthermore, no consideration is taken as to those items needed for the above-stated high-accuracy measurement of pattern dimensions. Accordingly, even if the technique disclosed in Patent Literature 1 is used to perform pattern dimension measurement, in cases where the edge line's inclination angle differs from the pattern track due to the edge roughness, a decrease in length measurement accuracy can take place, thereby making it difficult to perform the high-accuracy dimension measurement because of the fact that it uses a tangent line of the contour of the graphic form.

The present invention is the one that solves the problem and provides a pattern dimension measurement method and size measurement device capable of achieving high-accuracy pattern dimension measurement with suppressed influence of the roughness of pattern edges by a technique for taking into consideration the track and inclination angle of a pattern even when this pattern has inclination with respect to a pattern image of an object being inspected, i.e., inspection object. This invention also provides a program for causing a computer to execute the pattern dimension measurement method and a recording medium which records this program thereon.

Solution to Problem

A brief explanation of the summary of some representative ones of inventive concepts as disclosed herein is as follows.

(1) A pattern dimension measurement method is provided, which is for measuring dimensions of a pattern inclined relative to a pattern image of an inspection object, characterized by comprising the steps of detecting an auxiliary dot sequence indicating a track of the inclined pattern by using a signal waveform to be obtained from the inspection object pattern image, calculating, based on the detected auxiliary dot sequence, either an approximate curve of the track of the inclined pattern or a tangent line in a predetermined zone of the auxiliary dot sequence, detecting a signal waveform in a direction perpendicular to either the calculated approximate curve of the track of the inclined pattern or the calculated tangent line in the predetermined zone of the auxiliary dot sequence, and measuring dimensions of the inclined pattern by specifying a pattern edge position of the inclined pattern based on the signal waveform in the direction perpendicular to the detected approximate curve or the tangent line.

(2) A pattern dimension measurement method as recited in (1) is provided, which is characterized in that in a case where the inclined pattern is a straight line pattern slanted with respect to the inspection object pattern image, at the step of calculating either an approximate curve of the track of the inclined pattern or a tangent line in a predetermined zone of the auxiliary dot sequence, calculation is performed to determine an approximate curve of the track of the inclined pattern; at the step of detecting a signal waveform in the perpendicular direction, detection is performed to find a signal waveform in the perpendicular direction relative to the calculated approximate curve of the track of the inclined pattern; and at the step of measuring dimensions of the inclined pattern, an operation is performed to specify, based on the detected signal waveform in the perpendicular direction relative to the approximate curve, a pattern edge position of the inclined pattern, thereby measuring dimensions of the inclined pattern.

(3) A pattern dimension measurement method as recited in (1) is provided, which is featured in that in case the inclined pattern is a curved line pattern, at the step of calculating either an approximate curve of the track of the inclined pattern or a tangent line in a predetermined zone of the auxiliary dot sequence, calculation is performed to determine a tangent line in the predetermined zone of the auxiliary dot sequence; at the step of detecting a signal waveform in the perpendicular direction, detection is performed to find a signal waveform in the direction perpendicular to the calculated tangent line in the predetermined zone of the auxiliary dot sequence; and at the step of measuring dimensions of the inclined pattern, an operation is performed to specify, based on the detected signal waveform in the perpendicular direction relative to the tangent line, a pattern edge position of the inclined pattern to thereby measure dimensions of the inclined pattern.

(4) A pattern dimension measurement device is also provided, which is for measuring dimensions of a pattern inclined relative to a pattern image of an inspection object, characterized by comprising an electron beam irradiation means for irradiating an electron beam onto the inspection object, a detection means for detecting reflection electrons and secondary electrons to be released from the inspection object due to beam irradiation by the electron beam irradiation means, and an image processing means for making an inspection object pattern image based on a signal of the reflection electrons and secondary electrons detected by the detection means, for using a signal waveform obtained from the inspection object pattern image to detect an auxiliary dot sequence indicating a track of the inclined pattern, for calculating based on the detected auxiliary dot sequence an approximate curve of the track of the inclined pattern or a tangent line within a predetermined zone of the auxiliary dot sequence, for detecting a signal waveform in a direction perpendicular to the calculated approximate curve of the track of the inclined pattern or the calculated tangent line within the predetermined zone of the auxiliary dot sequence, for specifying a pattern edge position of the inclined pattern based on the detected signal waveform in the perpendicular direction relative to the approximate curve or the tangent line, and for measuring dimensions of the inclined pattern.

(5) A pattern dimension measurement device as recited in (4) is provided, which is characterized in that the image processing means has an auxiliary dot sequence detection means for detecting an auxiliary dot sequence indicating a track of the inclined pattern by using a signal waveform of the inspection object pattern image, an approximate-curve/tangent-line calculation means for calculating, based on the auxiliary dot sequence detected by the auxiliary dot sequence detection means, an approximate curve of the track of the inclined pattern or a tangent line in a predetermined zone of the auxiliary dot sequence, a signal waveform acquisition means for detecting a signal waveform in a direction perpendicular to either the approximate curve of the track of the inclined pattern as detected by the approximate-curve/tangent-line calculation means or the calculated tangent line in the predetermined zone of the auxiliary dot sequence, an edge detection means for specifying a pattern edge position of the inclined pattern based on the signal waveform in the perpendicular direction relative to the approximate curve or the tangent line as detected by the signal waveform acquisition means, and a size measurement means for measuring size of the inclined pattern based on data of the pattern edge position specified by the edge detection means.

(6) A program is also provided, which is for causing a computer to execute the pattern dimension measurement method as recited in any one of (1) to (3). Also provided is a record medium which stores this program therein.

(7) A program is also provided, which is for measuring dimensions of a pattern inclined relative to a pattern image of an inspection object, wherein the program causes the computer to execute a step of causing an auxiliary dot sequence detection unit to detect an auxiliary dot sequence indicating a track of an inclined pattern by using a signal waveform obtainable from the inspection object pattern image obtained by an image acquisition unit, a step of causing an approximate-linekangent-line calculation unit to calculate an approximate curve of the track of the inclined pattern or a tangent line within a predetermined zone of the auxiliary dot sequence based on the auxiliary dot sequence detected, a step of causing a size measurement unit to detect a signal waveform in a direction perpendicular to either the calculated approximate curve of the track of the inclined pattern or the calculated tangent line in the predetermined zone of the auxiliary dot sequence, and a step of causing an edge detection unit to specify a pattern edge position of the inclined pattern based on the detected signal waveform in the direction perpendicular to the approximate curve or the tangent line to thereby measure dimensions of the inclined pattern. Also provided is a recording medium which records this program thereon.

Advantageous Effects of Invention

According to this invention, it is possible to provide a pattern dimension measurement method and size measurement device capable of achieving high-accuracy pattern dimension measurement with suppressed influence of the roughness of pattern edges even for a pattern having inclination relative to the pattern image of an inspection object, along with a program for causing a computer to execute the pattern dimension measurement method and a recording medium which records this program thereon.

DESCRIPTION OF EMBODIMENTS

Figure 1:
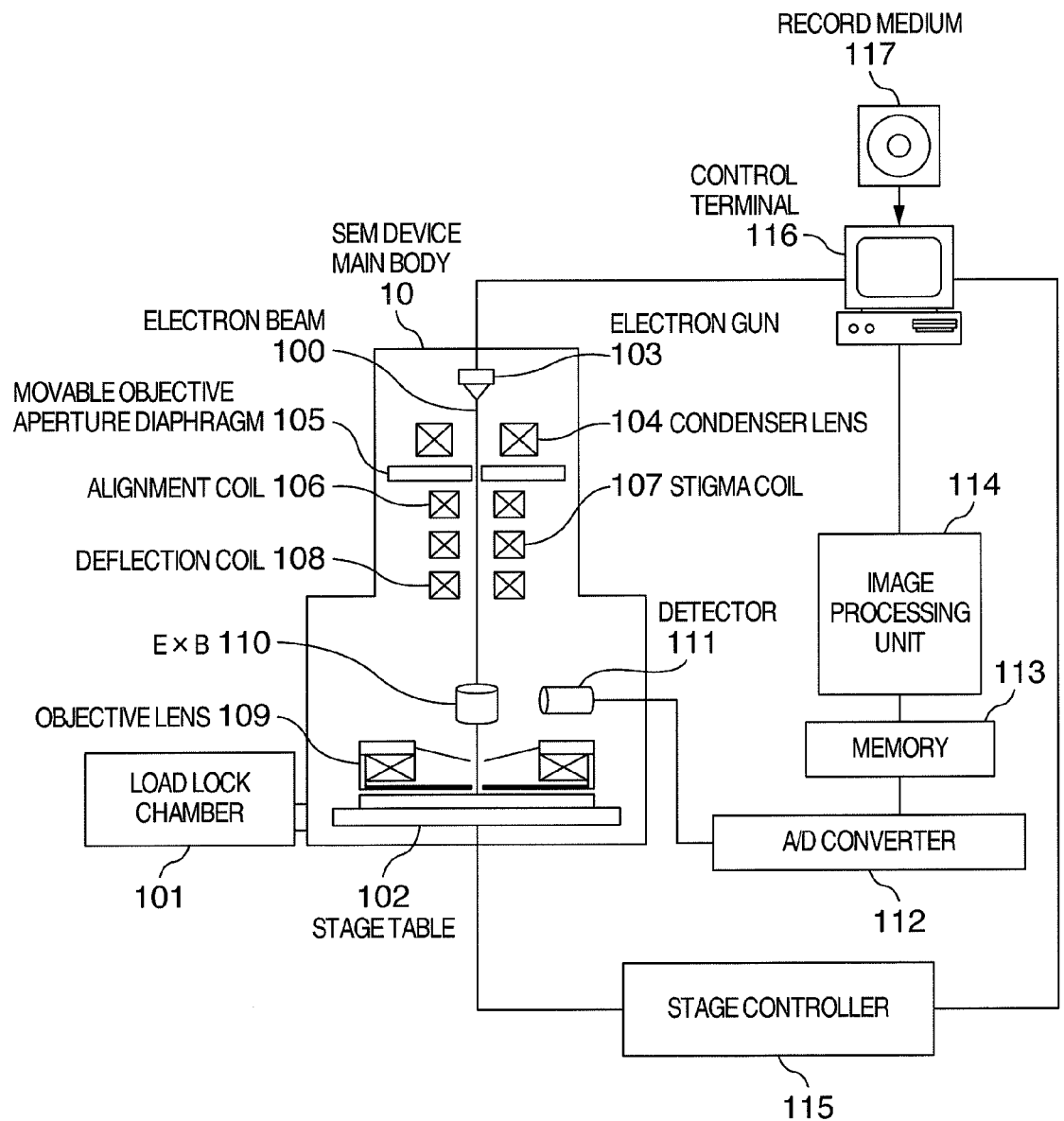
FIG. 1 A conceptual configuration diagram of a pattern dimension measurement device in accordance with this invention.

An explanation will be given, by using FIG. 1, of a schematic configuration of a pattern dimension measurement device in accordance with this invention. A SEM device main body 10 is constituted by appropriate use of a sample stage for setup of a wafer to be measured, an electron beam irradiation system for irradiating an electron beam 100 and controlling it to fall onto the wafer being measured, and a detection system for detecting reflection electrons and secondary electrons to be released from a top surface of the measurement wafer due to irradiation of the electron beam 100.

The sample stage is arranged by appropriate use of a load lock chamber 101 for transportation of the measurement wafer and a stage table 102 for holding thereon the wafer transferred.

The electron beam irradiation system is arranged by appropriate use of an electron gun 103 for outward emission of the electron beam 100, a condenser lens 104 existing on a pathway or route of the electron beam 100, a movable objective aperture diaphragm 105, an alignment coil 106, a stigma coil 107, a deflection coil 108 and an objective lens 109. The electron beam 100 emitted from the electron gun 103 is guided to travel through the condenser lens 104 and is subjected to correction of irradiation position deviation and astigmatism of the electron beam 100 by the alignment coil 106 and stigma coil 107 and also to control of an irradiation position on the sample by the deflection coil 108 so that the beam is focused by the objective lens 109 in such a way as to fall onto the measurement wafer on the stage table 102.

The detection system is arranged by appropriate use of an ExB 110 and a detector 111. The ExB 110 applies an electric field and magnetic field to reflection electrons and secondary electrons which are produced from inside of the measurement wafer due to irradiation of the electron beam 100 whereby the reflection electrons and secondary electrons are curved in a direction of the detector 111. The detector 111 detects these curved reflection electrons and secondary electrons.

The reflection electrons and secondary electrons detected by the detector 111 are converted by an A/D converter 112 into a digital signal, which is stored in a memory 113. An image processing unit 114 retrieves the digital signal stored in the memory 113 according to need and performs image construction, edge detection, pattern dimension measurement and other operations. A stage controller 115 is operating to control a position of the wafer on the stage table 102 at which the electron beam 100 irradiates it. A control terminal 116 controls an entirety of the SEM device main body 10 by performing adjustment of irradiation conditions of the electron beam 100 and overall control of its on-wafer irradiation position while enabling an image obtained by the image processing unit 114 to be output toward a display means. It is noted that the processing at the image processing unit 114 is controlled in a way pursuant to a recording medium 117, which records thereon an image processing program for causing a preset computer to execute the same.

Figure 2:
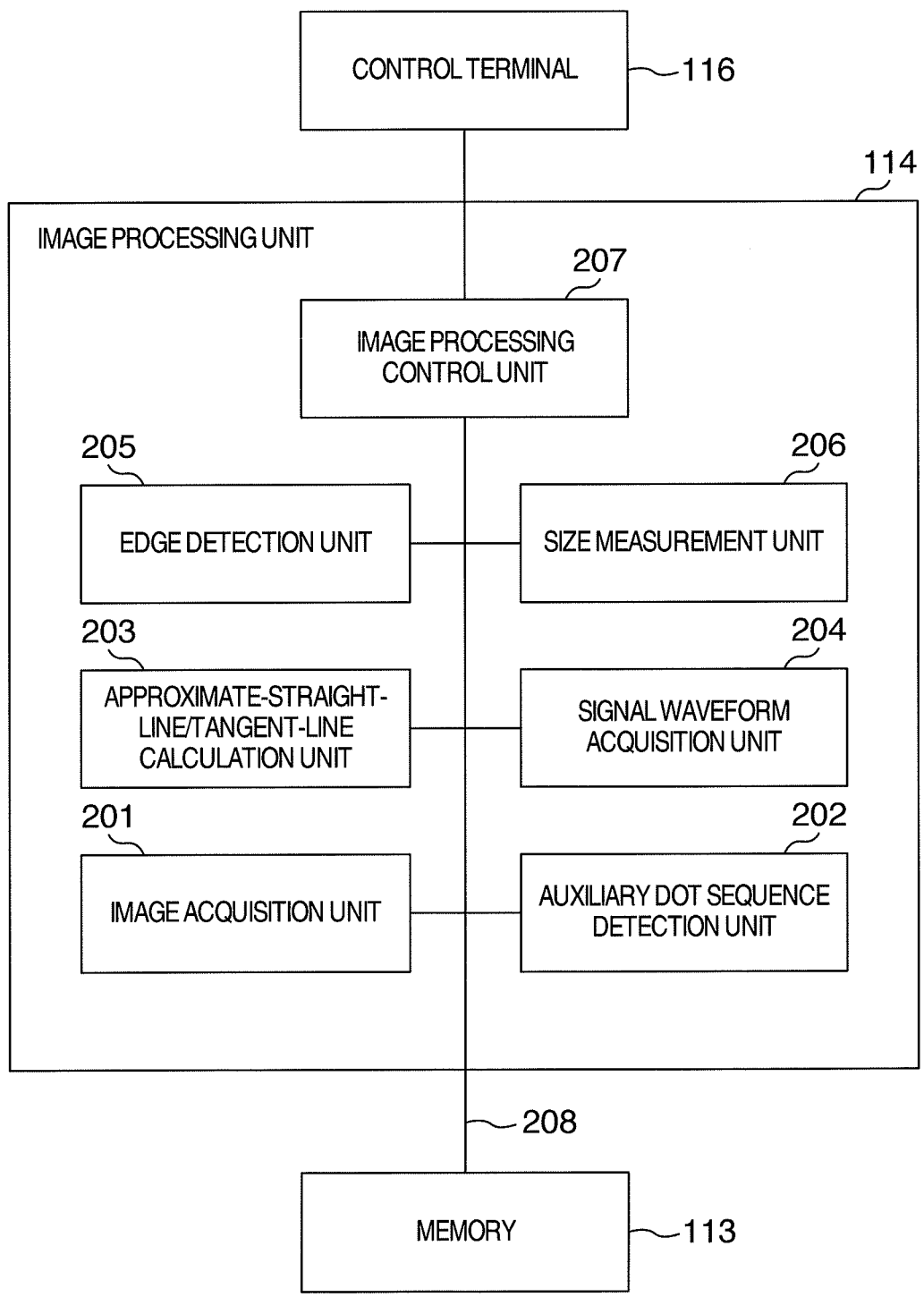
FIG. 2 A conceptual diagram of an internal configuration of an image processing unit.

A processing procedure at the image processing unit 114 will be explained with reference to FIG. 2. The digital signal taken out of the memory 113 is transmitted to an image acquisition unit 201 of the image processing unit 114. The image acquisition unit 201 uses the transmitted digital signal to construct it into image data. The image data obtained is output to an auxiliary dot sequence detection unit 202, thereby preparing an auxiliary dot sequence indicating the track of a pattern. Next, the image data used for creation of the auxiliary dot sequence is output to an approximate-straight-line/tangent-line calculation unit 203, for computation of a straight line indicating inclination of the auxiliary dot sequence. Here, in a case where no curved line portions are present in the resulting pattern on the image data, an approximate straight line of the auxiliary dot sequence is created at the approximate-straight-line/tangent-line calculation unit 203; in case a curved line portion is present in the pattern on the image data, a tangent line in a predetermined region or zone of the auxiliary dot sequence is calculated. The image data used for such calculation of the approximate straight line or the tangent line is then output to a signal waveform acquisition unit 204, which acquires a signal waveform in a direction perpendicular to the approximate straight line or the tangent line. The signal waveform thus acquired is output to an edge detection unit 205, for detection of an edge or edges of the pattern based on the signal waveform. Edge data detected is output to a dimension measurement unit 206, which measures pattern dimensions based on a distance between edges. The processing to be executed within the image processing unit 114 is controlled by the control terminal 116 by way of an image processing control unit 207. The digital signal and the image data are transmitted via a bus 208.

First Embodiment

Figure 3:
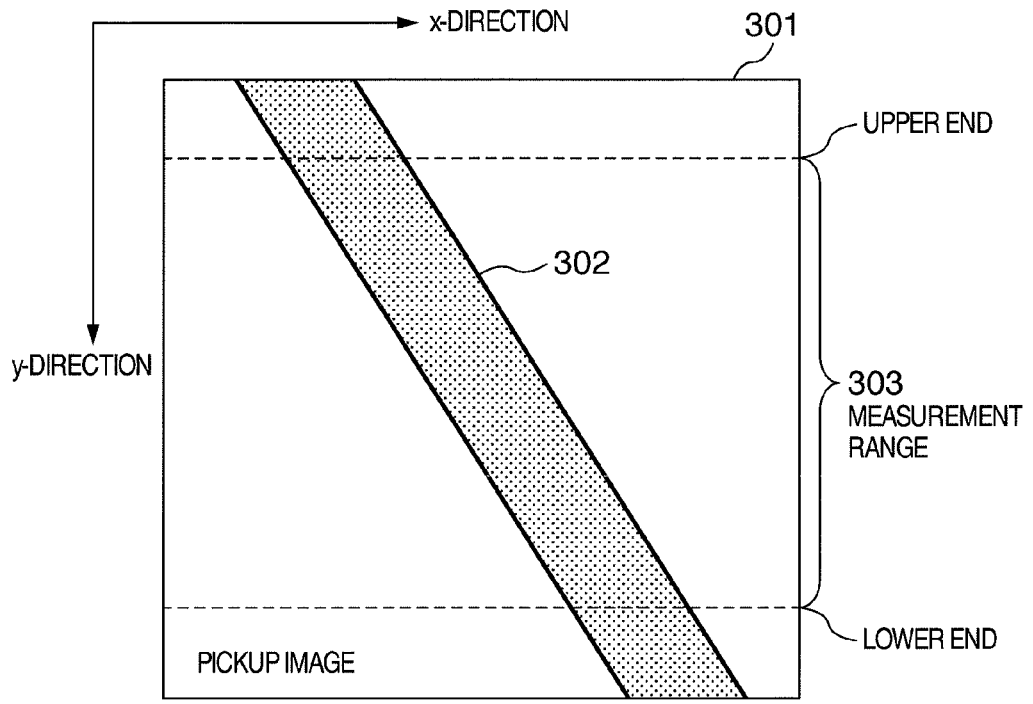
FIG. 3 A diagram showing one example of a pickup image.

Next, a detailed explanation will be given of the pattern dimension measurement method in accordance with this invention, by using a practical example of the image of a pattern being inspected—say, inspection object pattern image. A first embodiment of the inspection object pattern image will be explained while taking as an example here a pickup image 301 which contains therein a straight line pattern 302 having inclination with respect to the image's vertical direction or horizontal direction as shown in FIG. 3. Hereinafter, an x-direction shown in FIG. 3 should be interpreted, unless otherwise indicated, to refer to a horizontal direction extending from the left to the right of an image illustrated in the drawing whereas a y-direction is to be interpreted to indicate a vertical direction extending from the upside to downside of the illustrative image. Additionally, the processing to be set forth below should be interpreted to be executed in the y-direction from an upper end toward lower end within a measurement range 303 which is for allowing a user to designate a pattern to be measured, i.e., measurement object.

Firstly, a wafer on which is formed the straight line pattern 302 inclined with respect to the vertical direction or the horizontal direction of the image is transported from the load lock chamber 101 shown in FIG. 1 to the interior space of apparatus. Next, the straight line pattern on the wafer is scanned by the electron beam 100; a signal obtained is sent to the image acquisition unit 201, thereby acquiring an image of the straight line pattern slanted relative to the vertical or horizontal direction of the image.

A method for performing the processing of a resultant straight line pattern image to thereby measure pattern dimensions the will be explained with reference to FIGS. 4 through 10 below. FIGS. 4 to 9 show partial plan views of the straight line pattern image that was subjected to the processing within the image processing unit 114, and FIG. 10 shows a flow of the processing at the image processing unit 114.

Figure 4:
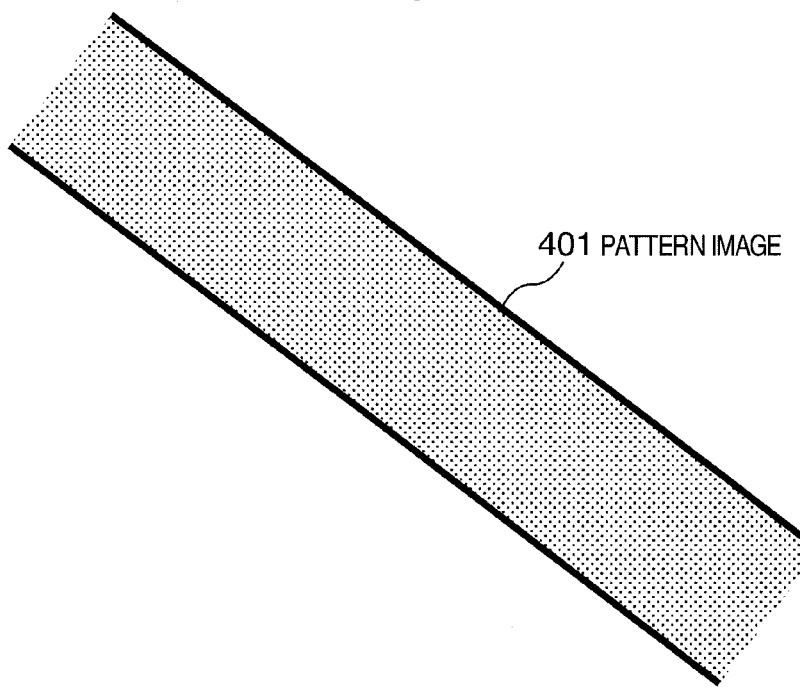
FIG. 4 A diagram showing a straight line pattern image.
Figure 5:
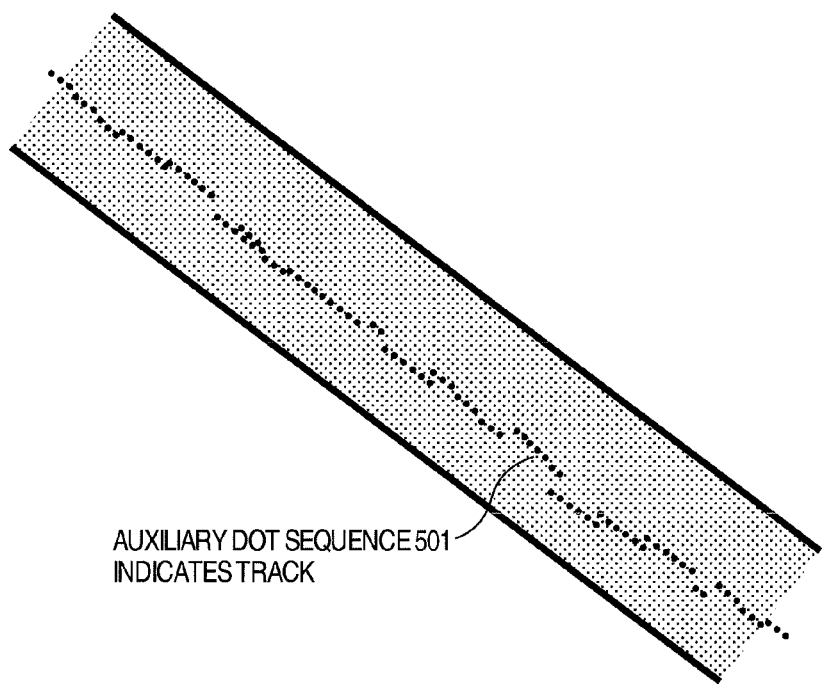
FIG. 5 A diagram showing an auxiliary dot sequence of the straight line pattern image.

The auxiliary dot sequence detection unit 202 applies processing to an acquired pattern image 401 shown in FIG. 4, thereby detecting an auxiliary dot sequence 501 indicating the track of the pattern shown in FIG. 5 (at step S1001). Core technologies used for the detection method of the auxiliary dot sequence 501 include a technique for utilizing the symmetricity of a pattern image and a scheme based on the matching with a reference signal waveform. These schemes will be set forth below.

Figure 11:
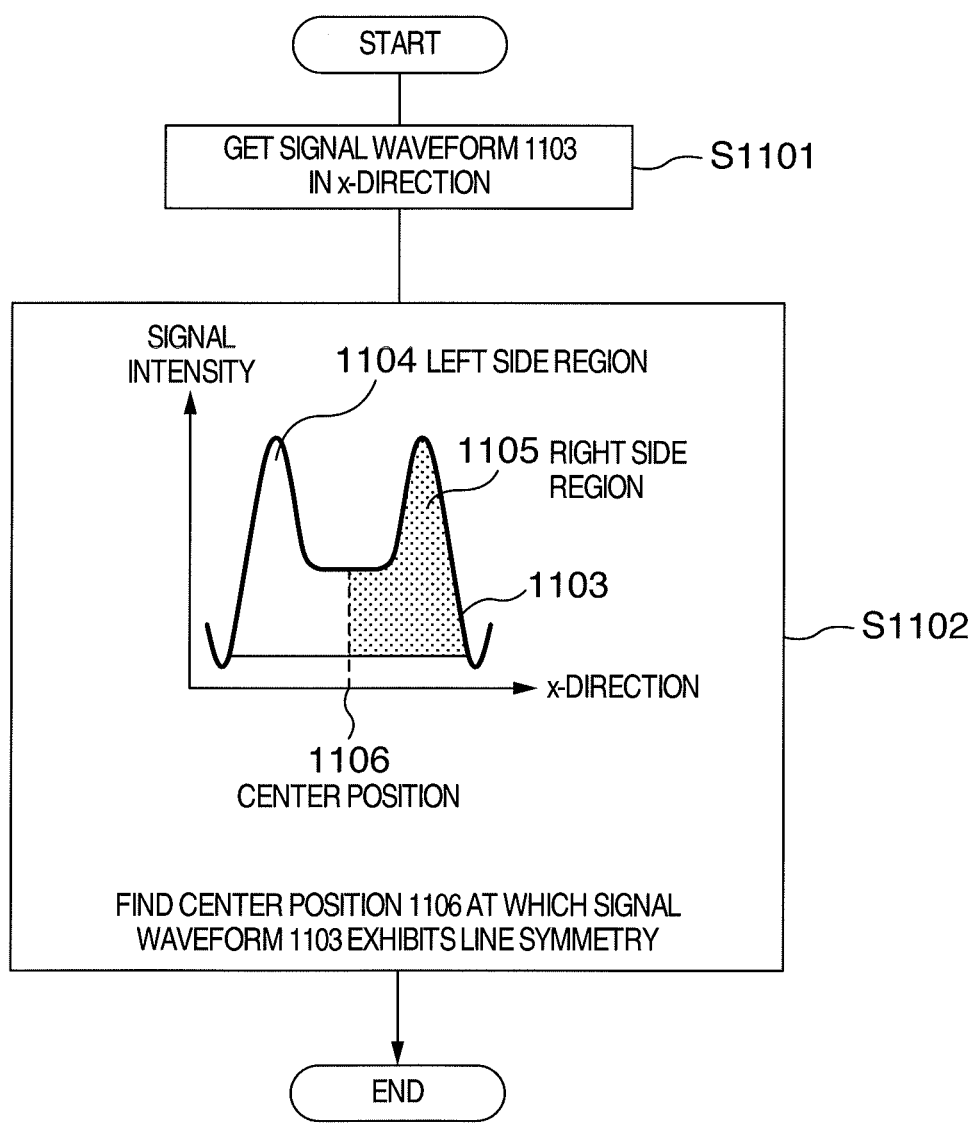
FIG. 11 A diagram showing a flow of detection of an auxiliary dot sequence using the symmetricity of a pattern image.

First, the technique utilizing the symmetricity of pattern image will be explained using FIG. 11. In this technique, what is done first is to acquire a signal waveform 1103 in the x-direction (S1101). Next, an operation is performed to detect a position at which a left-side region 1104 and a right-side region 1105 of the signal waveform 1103 become equal in shape to each other, i.e., a center position 1106 in the x-direction, at which the waveform 1103 exhibits line-symmetry (S1102). This processing is performed within the measurement range 303; then, let the resultant dot sequence of waveform 1106 be the auxiliary dot sequence 501.

Figure 12:
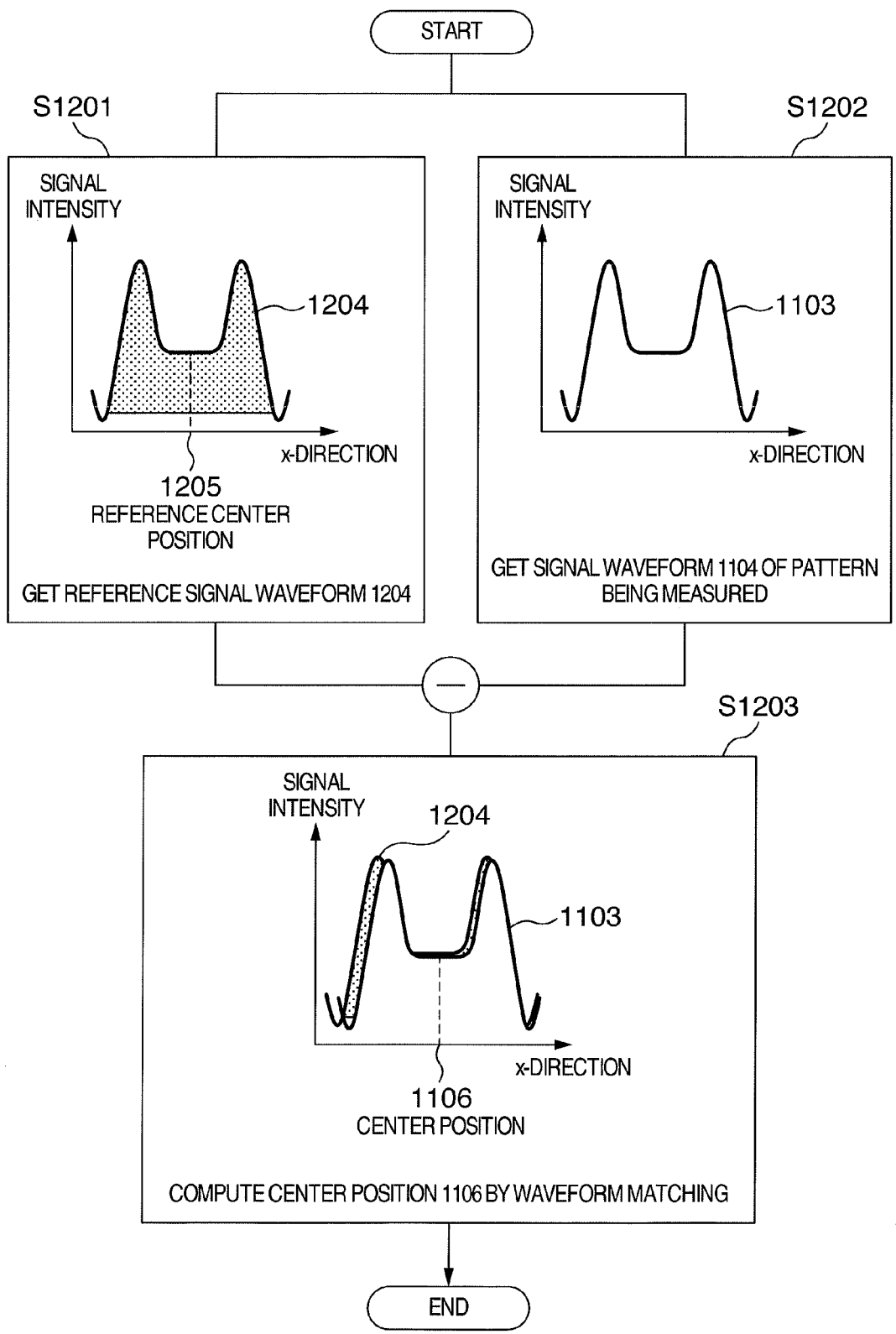
FIG. 12 A diagram showing a flow of auxiliary dot sequence detection using waveform matching of a signal waveform of pattern image with a reference signal waveform.

Next, the technique based on the matching with a reference signal waveform will be explained using FIG. 12. In this scheme, firstly, a reference signal waveform 1204 in the event of scanning a pattern in the x-direction is prepared separately; then, designation is performed to specify a reference center position 1205 in x-direction within the region of signal waveform 1204 (at step S1201). Next, an operation is performed to detect the signal waveform 1103 of pattern image 401 (S1202). Then, processing is performed to superpose the signal waveform 1103 and reference signal waveform 1204, wherein the position 1205 at the time these two waveforms are matched together is regarded as the center position 1106 of the signal waveform 1103 (S1203). A dot sequence of position 1106 at the time this procedure was performed within the range 303 is regarded as the auxiliary dot sequence 501. Although two specific auxiliary dot sequence detection schemes are explained here, these are not to be construed as limiting the invention, and other schemes may be employed. Also note that the auxiliary dot sequence is not limited to the above-stated way of taking it at the center position and may alternatively be arranged so that the auxiliary dot sequence is detected at a position deviated from the center when the need arises—e.g., in cases where its visibility decreases due to the presence of foreign matter. Any applicable modifications and settings may be employed on a case-by-case basis. For example, in a case where a pattern having a curved line portion to be later described is the measurement object, when it is demanded to obtain the curvature factor of a convex-side part of the curved line portion of the pattern, an attempt is made to take an auxiliary dot sequence at a position deviated from the center position to come close to the convex-side part; alternatively, when it is desired to obtain the curvature of a concave-side part, the auxiliary dot sequence is taken at a position deviated from the center position to approach the concave-side part.

Figure 6:
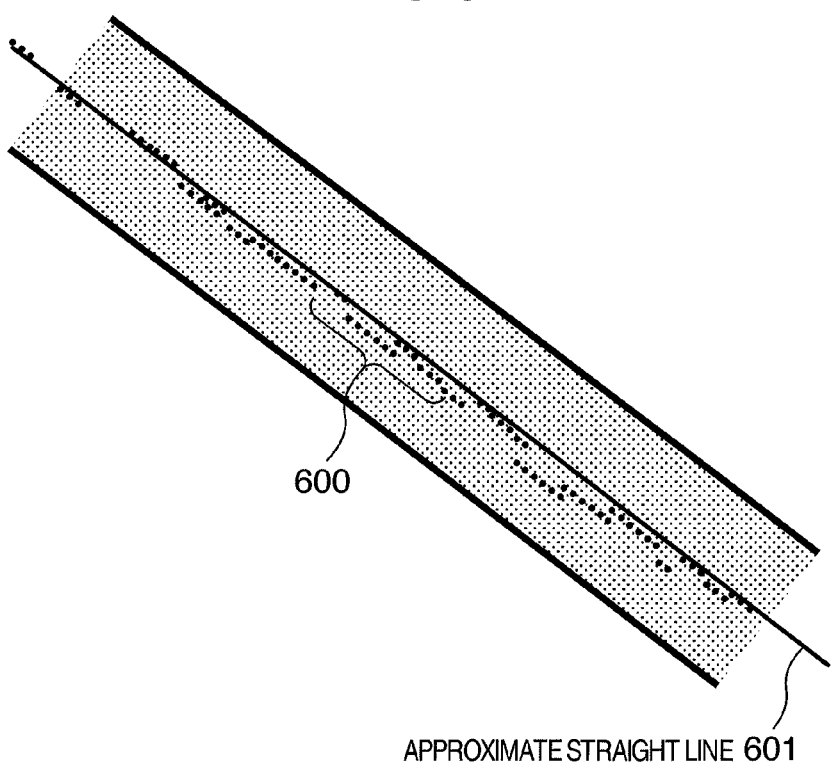
FIG. 6 A diagram showing an approximate straight line of the dot sequence of the straight line pattern image.

The detected auxiliary dot sequence 501 indicating the track of the pattern image 401 is output to the approximate-straight-line/tangent-line calculation unit 203. Based on the auxiliary dot sequence 501, the approximate-straight-line/tangent-line calculation unit 203 calculates an approximate straight line 601 by bracketing the approximate straight line 601 of the auxiliary dot sequence 501 within the measurement range 303 or, alternatively, by using an auxiliary dot sequence 600 within a predetermined zone as shown in FIG. 6 (at step S1002). The pattern image 401 and the calculated approximate straight line 601 are output to the signal waveform acquisition unit 204. The signal waveform acquisition unit 204 acquires from the pattern image 401 a signal waveform 801 in a direction perpendicular to the approximate straight line 601 (S1003). Regarding acquisition methodology of the signal waveform 801 in the direction perpendicular to the approximate straight line 601, an explanation will be given by taking two examples below.

Figure 7:
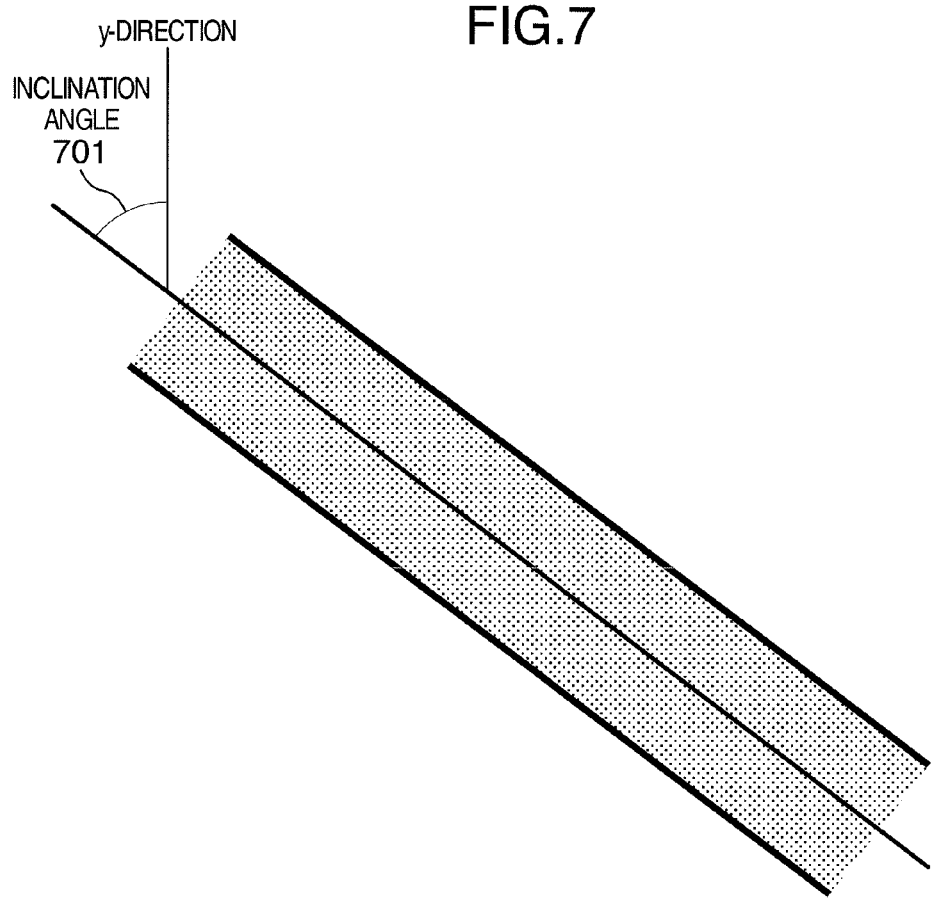
FIG. 7 A diagram showing an inclination angle of the approximate straight line of the auxiliary dot sequence of the straight line pattern image.
Figure 8:
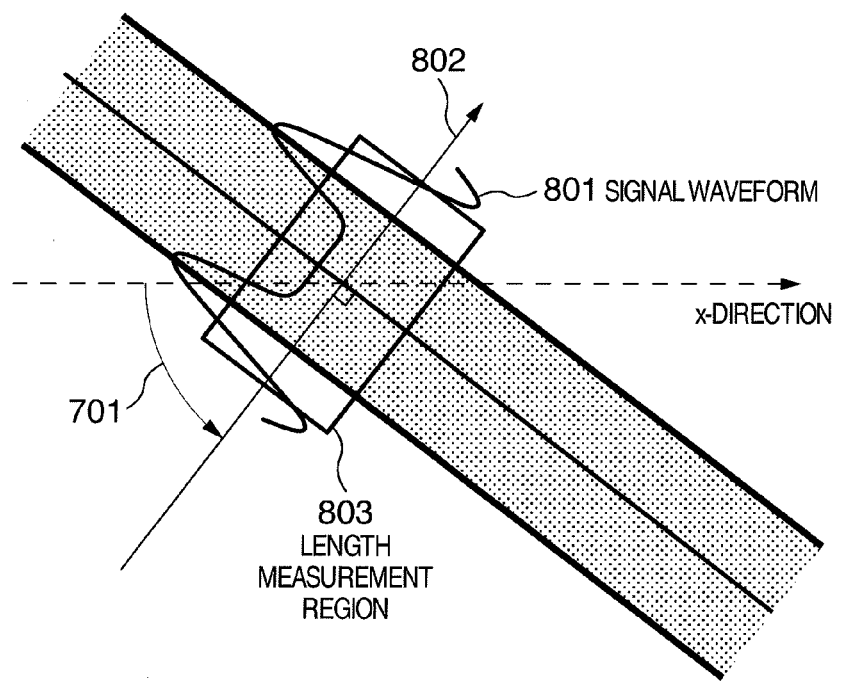
FIG. 8 A diagram showing a signal waveform in a direction perpendicular to the approximate straight line of the straight line pattern.

First, as shown in FIG. 7, an operation is performed to compute an inclination angle 701 that the approximate straight line 601 forms with the y-direction. Next, as shown in FIG. 8, the detection direction of signal waveform is rotated from the x-direction by a degree identical to the inclination angle 701. Further, a length measurement region 803 is projected thereon in such a manner as to intersect with a rotated direction 802 at right angles, thereby acquiring the signal waveform 801. Note here that the length measurement region 803 indicates an image region being subjected to the signal waveform detection.

Figure 9:
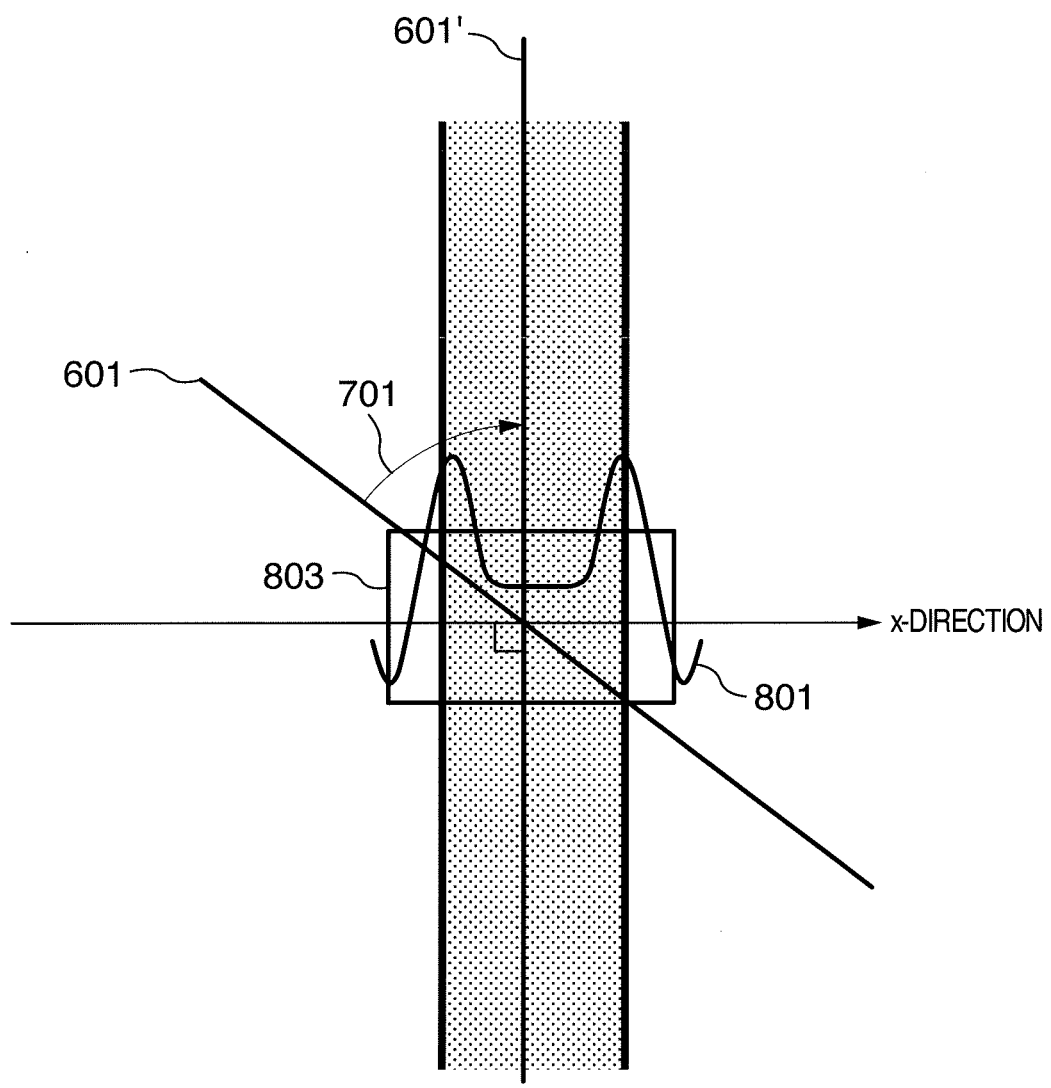
FIG. 9 A diagram showing a view of the straight line pattern rotated based on the inclination angle.
Figure 10:
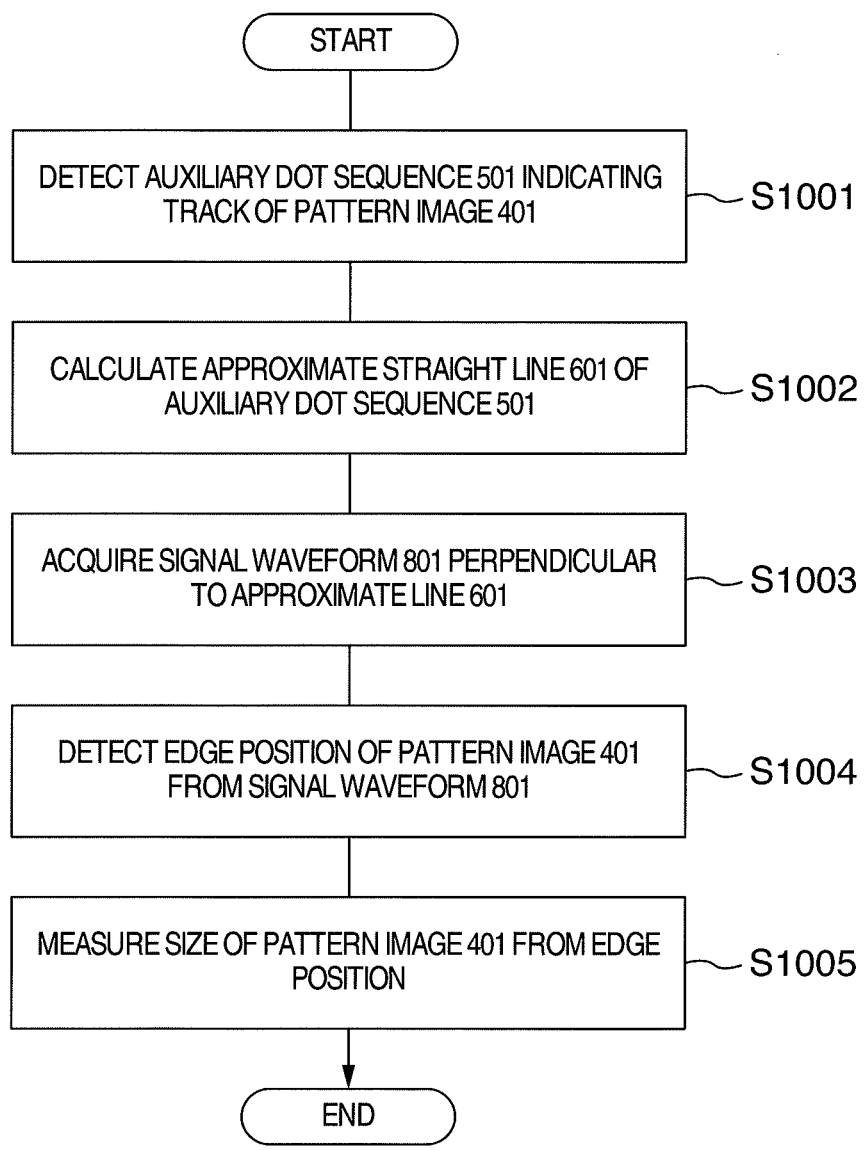
FIG. 10 A diagram showing a flow of dimension measurement processing of the straight line pattern.

As another technique for acquiring the signal waveform 801, there is a method for rotating an image rather than the signal waveform detection direction as shown in FIG. 9. With this method, an operation is performed to rotate the image based on the inclination angle 701 in such a manner that the approximate straight line 601 becomes in parallel with the y-direction. Since an approximate straight line 601' of the rotated pattern is at right angles to the x-direction, the processing required here is to project the length measurement region 803 so that it is in parallel with the line 601', thereby acquiring the signal waveform 801.

Figure 13:
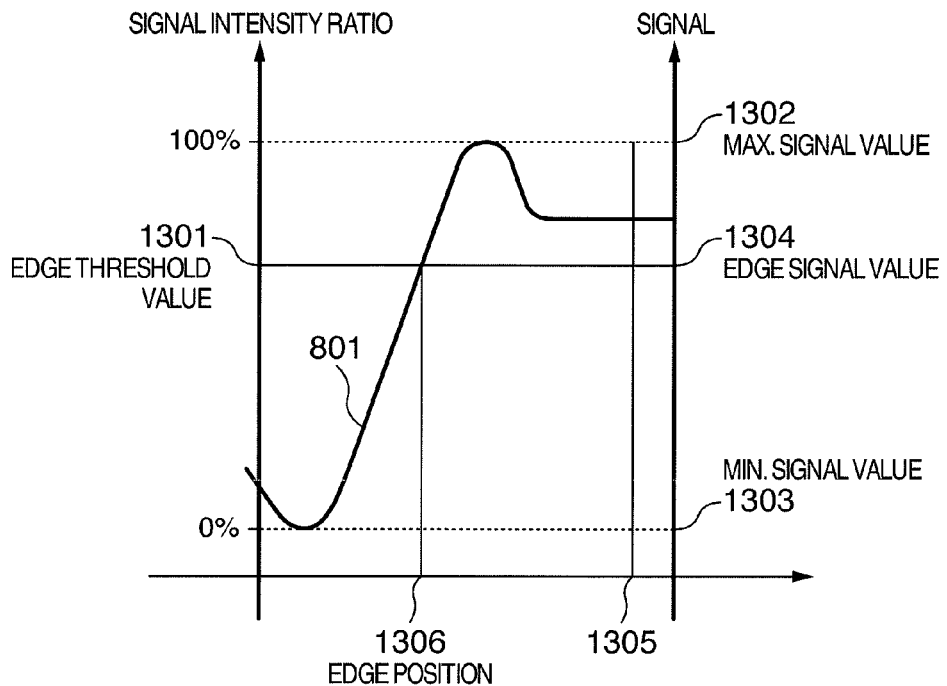
FIG. 13 A diagram showing a signal waveform for calculation of a pattern edge position.
Figure 14:
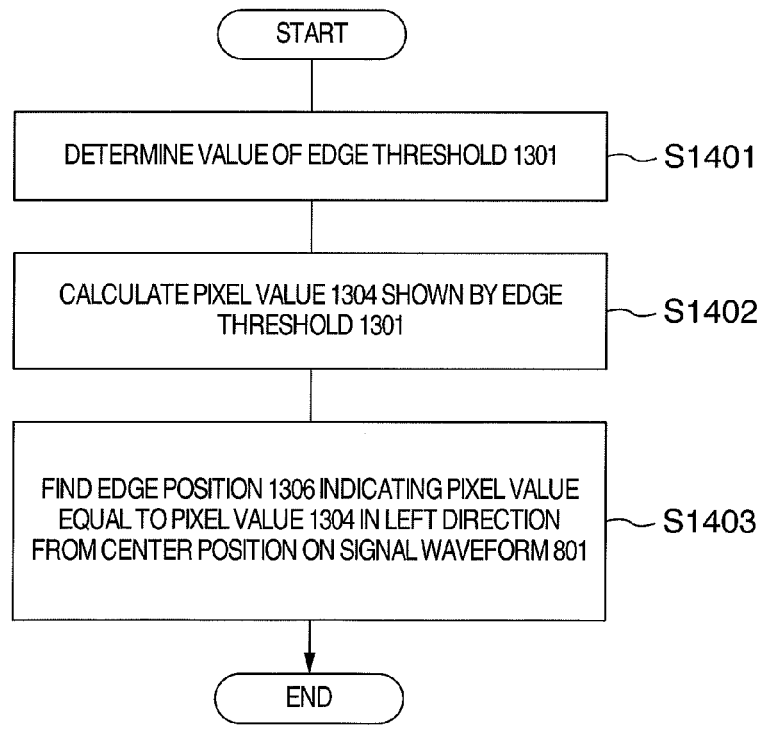
FIG. 14 A diagram showing a flow of pattern edge position detection.

The signal waveform 801 acquired in the way stated above is output to the edge detection unit 205. An edge position detection procedure of the edge detection unit 205 will be explained using FIGS. 13 and 14. FIG. 13 is a diagram showing the left half part of the signal waveform 801. The edge detection unit 205 detects an edge position in response to the user's arbitrary designation with the use of a display means or the like or, alternatively, based on a preset edge threshold value 1301 (S1401). The edge threshold value 1301 as used herein refers to a value which defines the signal value of an edge, wherein this value is represented by a signal intensity ratio when letting a maximum signal value 1302 of the signal waveform 801 be 100% and a minimum signal value 1303 be 0%. By using this edge threshold value 1301, an edge signal value 1304 is computed in accordance with Equation 1 presented below (S1402). (MATH. 1) Edge signal value 1304= (maximum signal value 1302−minimum signal value 1303)× edge threshold value 1301+minimum signal value 1303.

Figure 15:
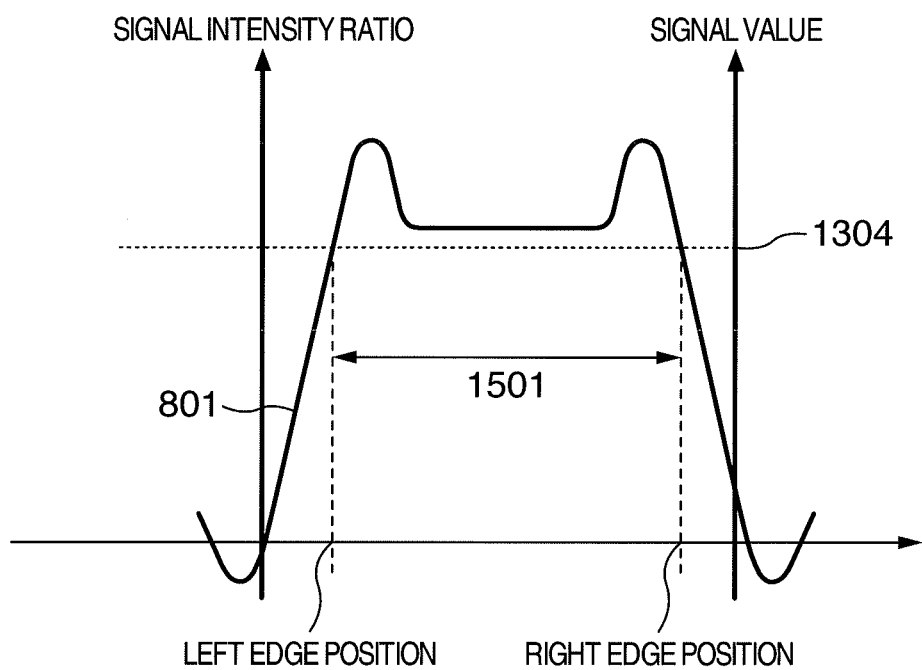
FIG. 15 A diagram showing a signal waveform for calculation of pattern dimensions.

Additionally, in order to avoid deterioration of edge detection accuracy due to the presence of foreign matter near or around the pattern image 401, the signal waveform 801 is scanned from the signal waveform 801's center position 1305 in the leftward direction to thereby detect an edge position 1306 indicating a signal value identical to the edge signal value 1304 (S1403). Similar processing is performed to detect an edge position of right-side edge of the pattern image 401. Position information of the both, right and left edges of pattern image 401 thus obtained in this way is output to the dimension measurement unit 206. As shown in FIG. 15, the dimension measurement unit 206 calculates a distance 1501 between these edges from the detected edge positions of both ends (S1006). The resulting edge-to-edge distance 1501 becomes a dimension value of such pattern.

Figure 16:
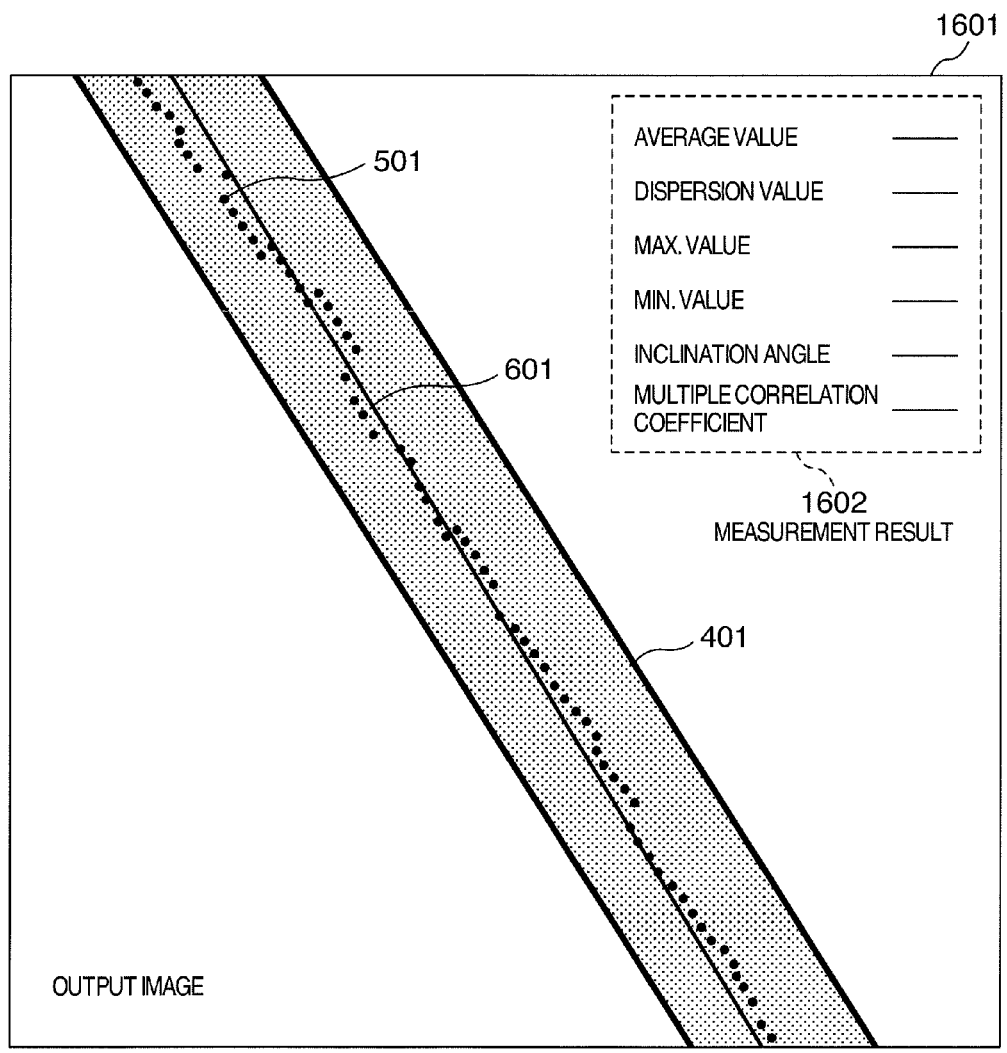
FIG. 16 A diagram showing an output image of straight line pattern.
Figure 17:
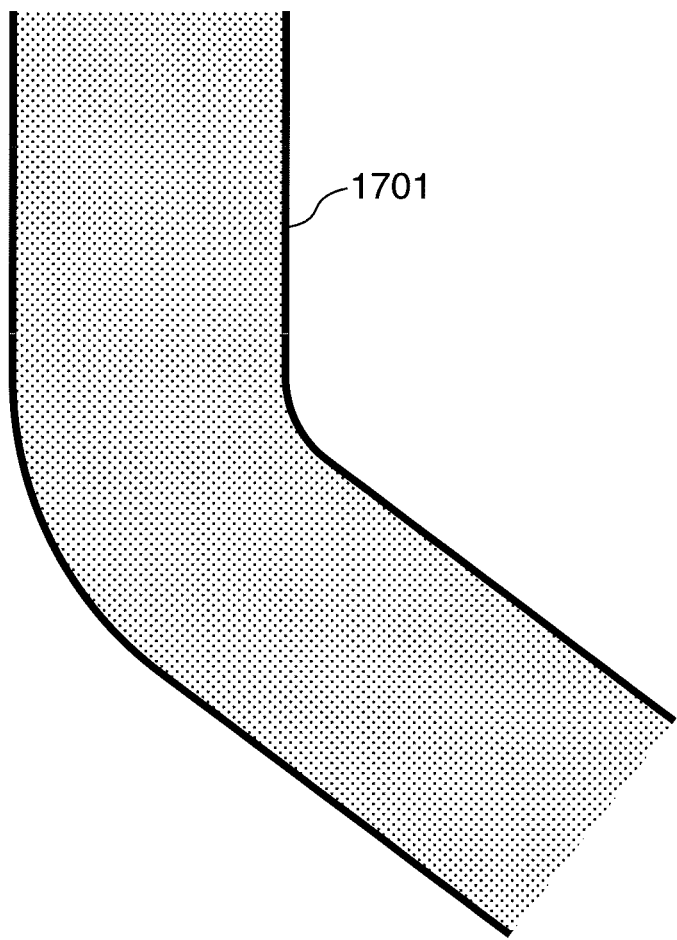
FIG. 17 A diagram showing a curved line pattern image.

Finally, at least one of the detected auxiliary dot sequence 501 and approximate straight line 601 is output onto the pickup image 301 that is displayed at the display means. FIG. 16 shows an output image 1601 as output thereto. In addition to the auxiliary dot sequence 501 and approximate straight line 601, at least one or more of other items may be output as a measurement result 1602, which items include an average value of pattern size values 1501 within the measurement range 303, a dispersion value of pattern size values 1501, a maximum value of pattern size values 1501, a minimum value of pattern size values 1501, an inclination angle 701 obtained by this processing, and a multiple correlation coefficient indicative of the fitting degree of the approximate straight line 601 with respect to the auxiliary dot sequence 501. Note here that the form for output to the display means is not limited to the above-stated one and may be modified in a variety of ways. Also note that in cases where the user selects a dot or a region on the display screen, the size value of such dot or region may be displayed along with measurement results. For example, in case a wafer map with measured portions being displayed therein and an output image are displayed simultaneously, the following design may be employed: when the user selects one of the measured portions being displayed in the wafer map, an output image containing therein a measurement result corresponding to this measured portion is displayed. Furthermore, another design is employable, which is to display both the output image of a measured portion and the design data of this measured portion on a single screen at a time, thereby providing a visual representation which makes it possible to readily perform the comparison of a design data value(s) with actual measurement result(s).

Additionally, a program for causing a computer to execute the above-stated processing procedure of pattern dimension measurement using the pickup image 301 is recorded on a recording medium 117. With this arrangement, even where the need arises for performing similar length measurement with the use of another scanning electron microscope for example, it becomes possible to readily achieve similar pattern dimension measurement by causing a computer of the scanning electron microscope to read the recording medium.

Second Embodiment

Figure 22:
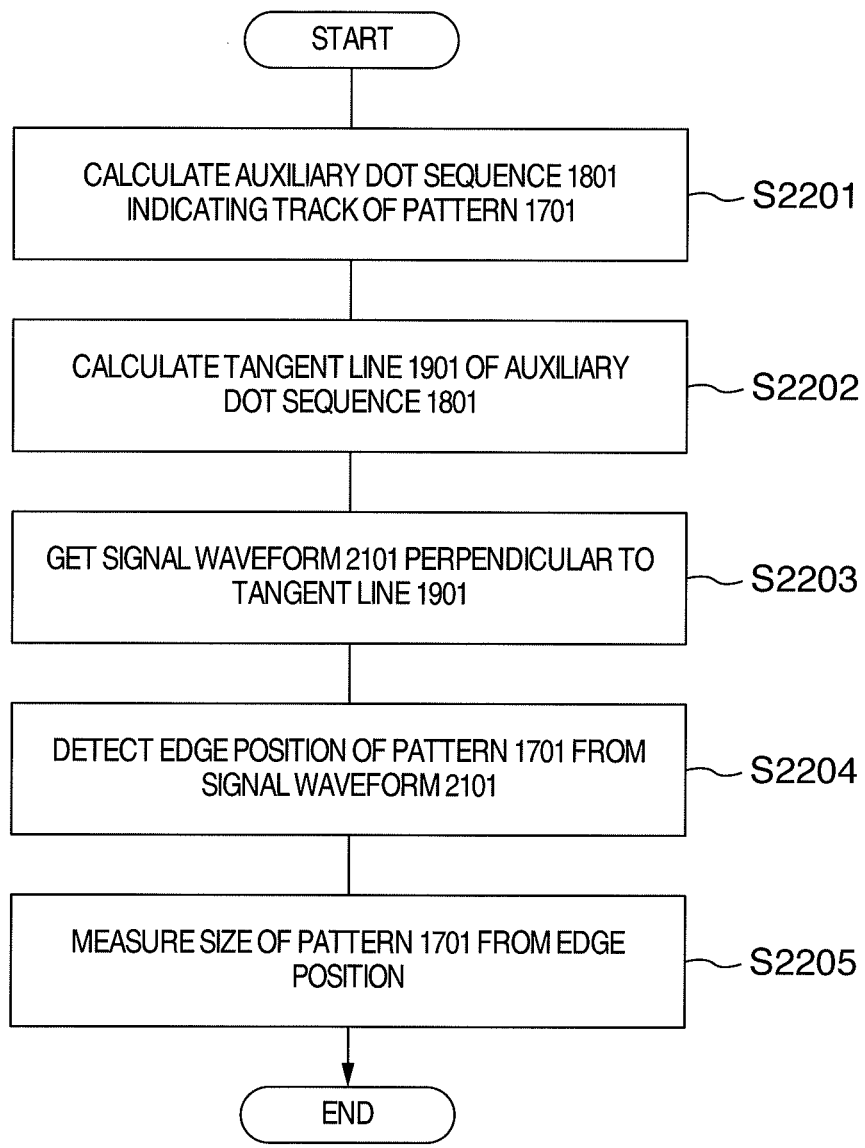
FIG. 22 A diagram showing a flow of curved line pattern dimension measurement processing.

Next, a pattern dimension measurement method will be explained using FIGS. 17 to 22 as a second embodiment of the inspection object pattern image while taking for example the case of a pattern having a curved line portion(s). FIGS. 17 to 21 show partial views of a curved line pattern image resulting from the processing within the image processing unit 114, and FIG. 22 shows a processing flow of the image processing unit 114. In the description below, the pattern with curved line portions will be simply referred to as a curve pattern.

First, a wafer on which is formed a curve pattern having inclination with respect to the y-direction is delivered to the interior of apparatus from the load lock chamber 101 shown in FIG. 1. Next, an electron beam 100 is used to scan the curve pattern; then a resultant signal is sent to the image acquisition unit 201, thereby acquiring a curve pattern image 1701 shown in FIG. 17.

Figure 18:
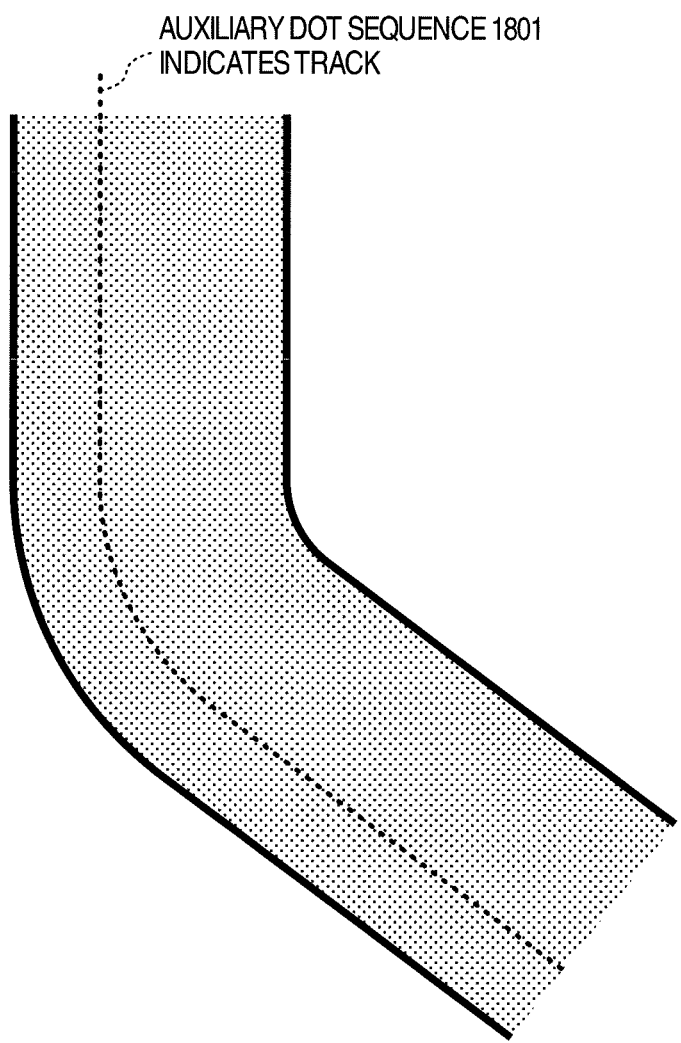
FIG. 18 A diagram showing an auxiliary dot sequence of the curved line pattern.
Figure 19:
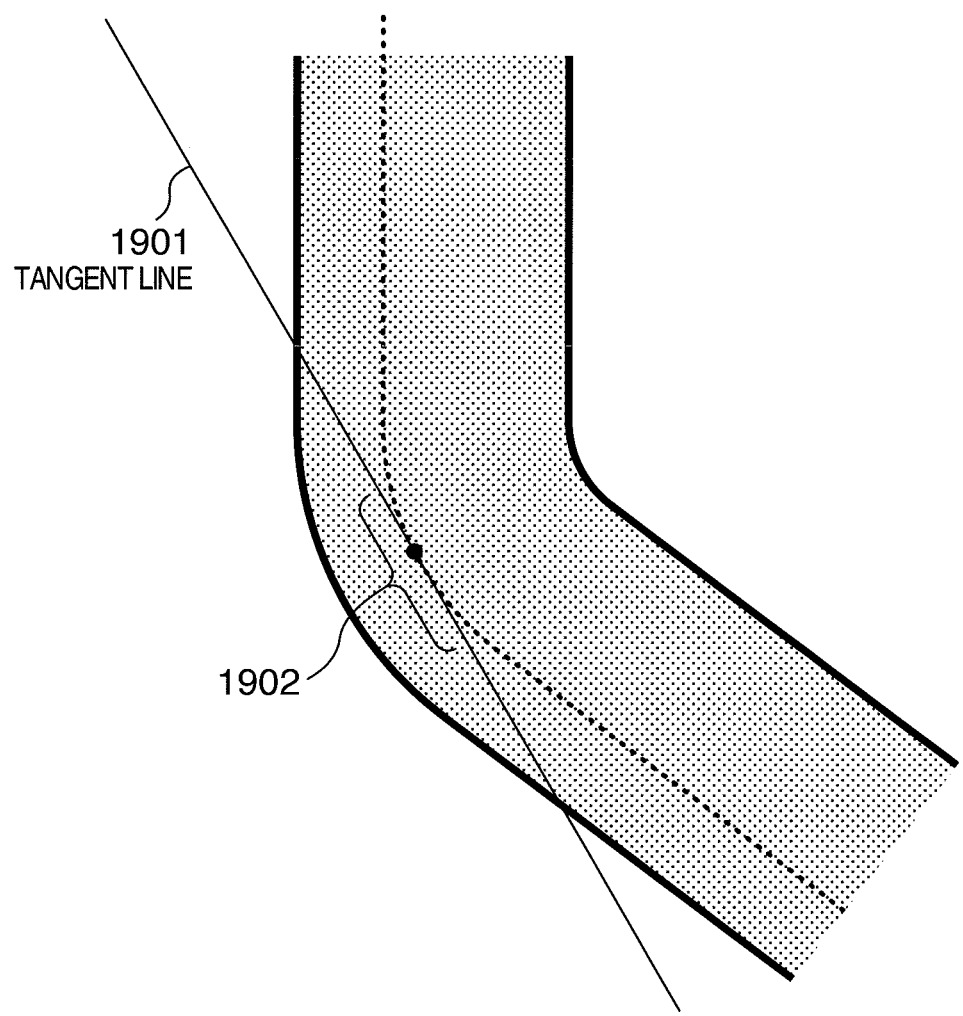
FIG. 19 A diagram showing a tangent line of the auxiliary dot sequence of the curved line pattern.
Figure 20:
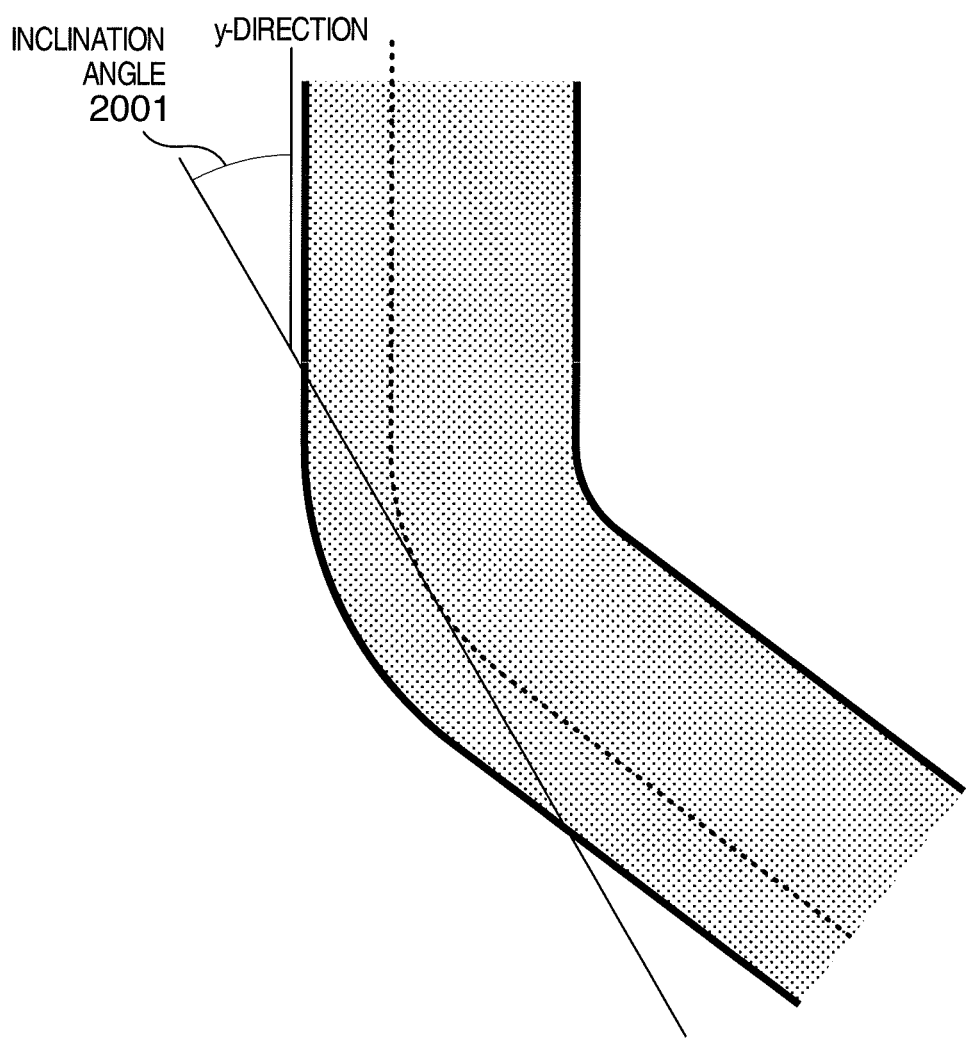
FIG. 20 A diagram showing an inclination angle of the tangent line of the auxiliary dot sequence of the curved line pattern.
Figure 21:
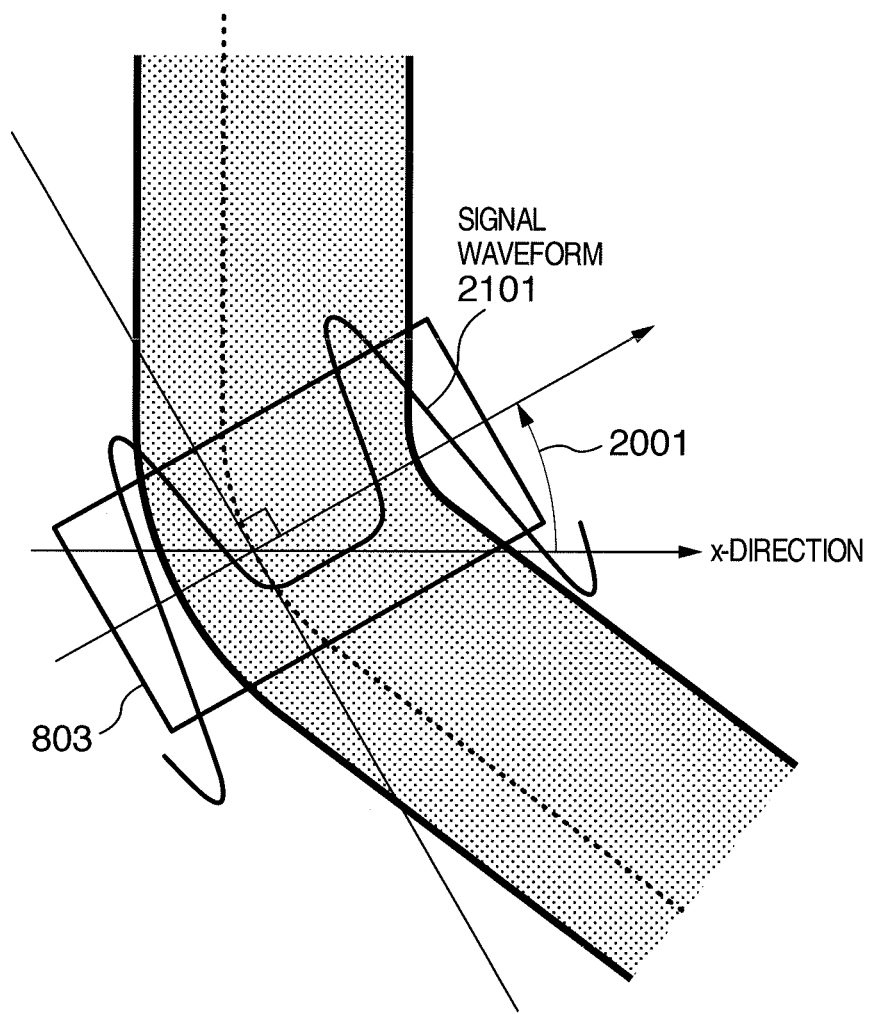
FIG. 21 A diagram showing a signal waveform in a direction perpendicular to the inclination of the curved line pattern.

The acquired curve pattern image 1701 is sent to the auxiliary dot sequence detection unit 202 and processed by the auxiliary dot sequence detection unit 202 whereby an auxiliary dot sequence 1801 indicating the track of such pattern is detected as shown in FIG. 18 (at step S2201). A detection method of the auxiliary dot sequence 1801 is the same as that of the first embodiment. The auxiliary dot sequence 1801 detected from the curve pattern image 1701 is output to the approximate-straight-line/tangent-line calculation unit 203. As shown in FIG. 19, the approximate-straight-line/tangent-line calculation unit 203 detects a tangent line 1901 of the auxiliary dot sequence 1801 (S2202). The tangent line 1901 is detected by applying function approximation to a predetermined zone 1902 of the auxiliary dot sequence 1801. The predetermined zone 1902 may be designated by the user; alternatively, a preset one may be used. The curve pattern image 1701 with the tangent line 1901 being detected is output to the signal waveform acquisition unit 204. As shown in FIG. 20, the signal waveform acquisition unit 204 calculates an inclination angle 2001 of the tangent line 1901 with respect to the y-direction and, based on the calculated inclination angle 2001, acquires a signal waveform 2101 in a direction perpendicular to the tangent line 1901 (S2203). An acquisition method of the signal waveform 2101 is the same as the technique as set forth in the first embodiment. The signal waveform 2101 is output to the edge detection unit 205. As has been stated in the first embodiment, the edge detection unit 205 determines an edge position on the signal waveform 2101 in accordance with the user's arbitrary definition using the display means or the like or, alternatively, determines it by use of a predetermined edge threshold value 1301 (S2204). The resultant edge position is output to the dimension measurement unit 206, which calculates a distance between the both, right and left edges on the pattern from coordinate values of these edges to thereby measure dimensions of the pattern (S2205). The resulting edge-to-edge distance becomes a dimension value of such pattern. Although the curve pattern is such that the inclination angle 2001 is different depending upon a position to be measured on the pattern, the use of a technique for detecting the tangent line 1901 in units of predetermined segments makes it possible to measure the pattern size in a similar way to that of a straight line.

Figure 23:
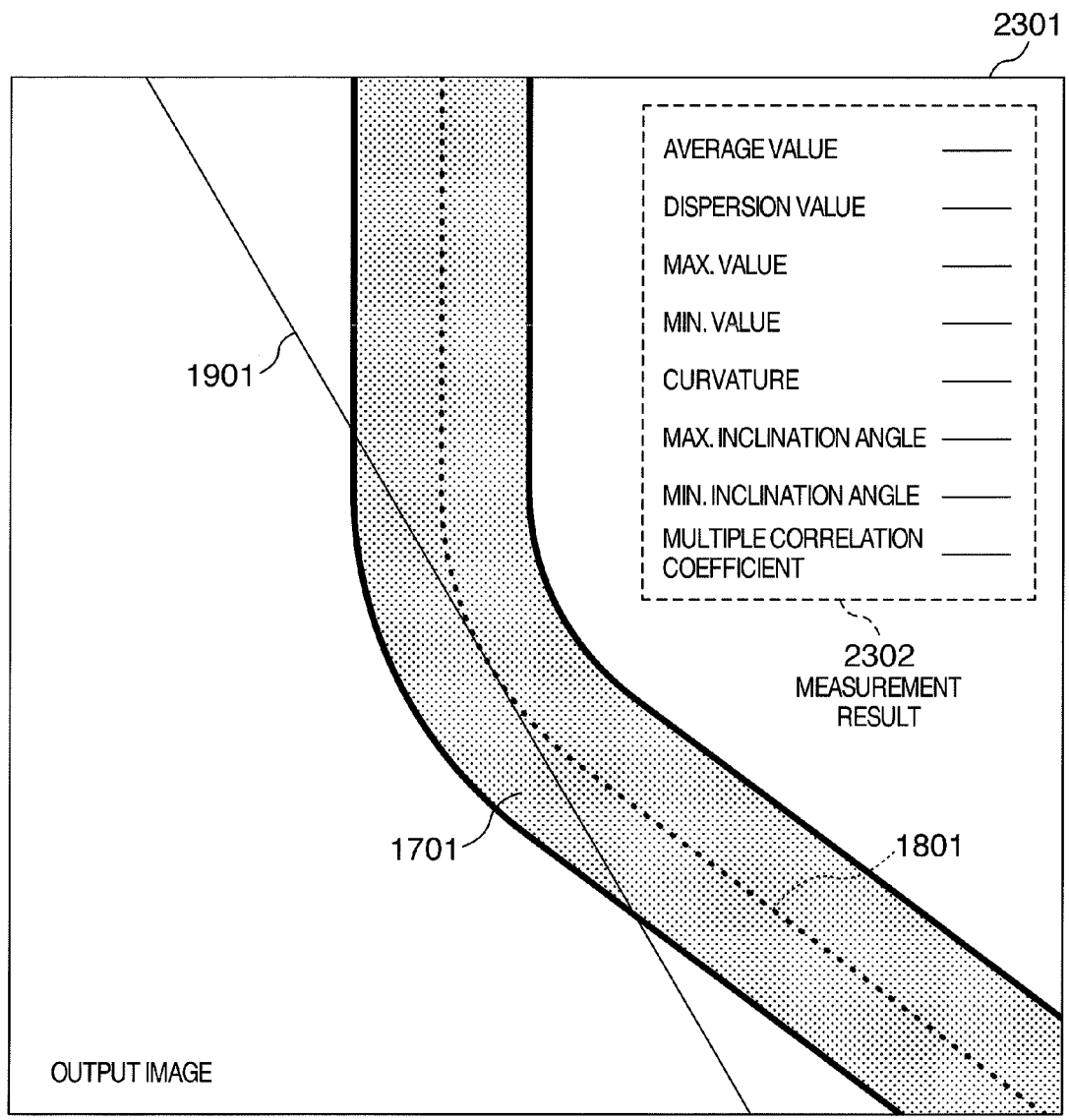
FIG. 23 A diagram showing an output image of curved line pattern.

Finally, in a similar way to the first embodiment, at least one of the detected auxiliary dot sequence 1801 and tangent line 1901 is output onto a pickup image being displayed on the display means. See FIG. 23, which shows an output image 2301 which was output. In addition to the auxiliary dot sequence 1801 and the tangent line 1901, at least one or more of other items may be output onto the curve pattern image 1701 as a measurement result 2302, which items include an average value of pattern size values 1501 within the measurement range 303, a dispersion value of pattern size values 1501, a maximum value of pattern size values 1501, a minimum value of pattern size values 1501, a maximum inclination angle of the tangent line 1901, a minimum inclination angle of the tangent line 1901, and a multiple correlation coefficient indicating the fitting degree of the tangent line 1901 with respect to the auxiliary dot sequence 1801. Note here that the form for output to the display means is not limited to the above-stated one and is modifiable in a variety of ways as in the example that has been set forth in the first embodiment. For example, in cases where the user selects a dot or a region of the auxiliary dot sequence 1801 on the display screen, the tangent line and/or the size value of such dot or region may be displayed along with the measurement result.

It is noted here that although in this second embodiment the explanation was given by taking as an example the pattern having a single curved line portion, this is not to be construed as limiting the invention, and it is needless to say that the concept may also be applicable to a wave-shaped pattern having a plurality of curved line portions. For example, in case there are two or more curved line portions in one output image, it may be designed to display a plurality of measurement results in units of curved line portions simultaneously or to display one of them at a time by execution of switching in response to the user's selection.

Additionally, a program for causing a computer to execute the above-stated procedure of the pattern dimension measurement processing is recorded on a recording medium 117 whereby it becomes possible, even where a need is felt to perform similar length measurement by using another scanning electron microscope as an example, to readily achieve similar pattern dimension measurement by causing a computer of such scanning electron microscope to read it.

As stated above, in accordance with this invention, in the process of measuring a straight line pattern inclined relative to an image and a pattern having curved line portions, pattern dimension measurement is performed by detection of an auxiliary dot sequence indicating the track of a pattern and an inclination angle based on a signal waveform of an entirety of the pattern which combines together the pattern's inside part and both edges. With this technique, even if roughness takes place at a one-side edge, a signal value of the pattern inside or at an edge on the opposite side does not depend on such the roughness; thus, it is possible to accurately detect the inclination angle when compared to an approach depending on the one-side edge only, thereby making it possible to accomplish high-accuracy measurement with enhanced suppressibility of the influence of the roughness of pattern edges.

Although the invention made by the inventors named in the attached application form has been concretely described based on some embodiments thereof, it is needless to say that this invention should not exclusively be limited to the above-stated embodiments and may be modified and altered in a variety of ways without departing from the spirit and scope of the invention.

REFERENCE SIGNS LIST

10 . . . SEM Device Main Body, 100 . . . Electron Beam, 101 . . . Load Lock Chamber, 102 . . . Stage Table, 103 . . . Electron Gun, 104 . . . Condenser Lens, 105 . . . Movable Objective Aperture Diaphragm, 106 . . . Alignment Coil, 107 . . . Stigmatic Coil, 108 . . . Deflection Coil, 109 . . . Objective Lens, 110 . . . ExB, 111 . . . Detector, 112 . . . A/D Converter, 113 . . . Memory, 114 . . . Image Processing Unit, 115 . . . Stage Controller, 116 . . . Control Terminal, 117 . . . Recording Medium, 201 . . . Image Acquisition Unit, 202 . . . Auxiliary Dot Sequence Detection Unit, 203 . . . Approximate-Straight-Line/Tangent-Line Calculation Unit, 204 . . . Signal Waveform Acquisition Unit, 205 . . . Edge Detection Unit, 206 . . . Size Measurement Unit, 207 . . . Image Processing Control Unit, 208 . . . Bus, 301 . . . Pickup Image, 302 . . . Straight Line Pattern, 303 . . . Measurement Range, 401 . . . Pattern Image, 501 . . . Auxiliary Dot Sequence, 601 . . . Approximate Straight Line, 701 . . . Inclination Angle, 801 . . . Signal Waveform, 802 . . . Signal Waveform Detection Direction After Rotation, 803 . . . Length Measurement Region, 1103 . . . Signal Waveform in X-Direction, 1104 . . . Left-Side Area of Signal Waveform, 1105 . . . Right-Side Area of Signal Waveform, 1106 . . . Center Position of Signal Waveform, 1204 . . . Reference Signal Waveform, 1205 . . . Reference Center Position, 1301 . . . Edge Threshold Value, 1302 . . . Maximum Signal Value, 1303 . . . Minimum Signal Value, 1304 . . . Edge Signal Value, 1305 . . . Center Position of Signal Waveform, 1306 . . . Edge Position, 1501 . . . Pattern Size, 1601 . . . Output Image of Straight Line Pattern, 1602 . . . Straight Line Pattern Measurement Result, 1701 . . . Curved Line Pattern Image, 1801 . . . Auxiliary Dot Sequence of Curved Line Pattern, 1901 . . . Tangent Line, 2001 . . . Inclination Angle of Tangent Line, 2101 . . . Signal Waveform Perpendicular to Tangent Line, 2301 . . . Output Image of Curved Line Pattern, 2302 . . . Curved Line Pattern Measurement Result.

The invention claimed is:

1. A pattern dimension measurement method for measuring dimensions of a pattern inclined relative to a pattern image of an inspection object, said method being performed by an image processing control unit programmed to perform steps comprising:
 a step of detecting an auxiliary dot sequence indicating a track of the inclined pattern by using a signal waveform to be obtained from the inspection object pattern image;
 a step of calculating, based on the detected auxiliary dot sequence, an approximate curve of the track of the inclined pattern or a tangent line in a predetermined zone of said auxiliary dot sequence;
 a step of detecting a signal waveform in a direction perpendicular to the calculated approximate curve of the track of the inclined pattern or the calculated tangent line in the predetermined zone of said auxiliary dot sequence;
 a step of measuring dimensions of the inclined pattern by specifying a pattern edge position of the inclined pattern based on the signal waveform in the direction perpendicular to the detected approximate curve or the tangent line;
 calculating an angle of inclination of the approximate curve or the tangent line with respect to a vertical direction or a horizontal direction of the inspection object pattern image; and
 calculating, based on the inclination angle calculated, the signal waveform in the perpendicular direction; and
 wherein said step of detecting a signal waveform in the perpendicular direction includes:
 performing detection in a direction rotated by a degree corresponding to the calculated inclination angle, thereby detecting the signal waveform in the perpendicular direction.

2. The pattern dimension measurement method according to claim 1, wherein said step of detecting an auxiliary dot sequence includes:
 performing detection by utilizing symmetricity of a signal waveform obtained from the inspection object pattern image.

3. The pattern dimension measurement method according to claim 1, wherein said step of detecting an auxiliary dot sequence includes:
 performing detection by matching of the signal waveform obtained from the inspection object pattern image and a preformed reference signal waveform.

4. A pattern dimension measurement method for measuring dimensions of a pattern inclined relative to a pattern image of an inspection object, said method being performed by an image processing control unit programmed to perform steps comprising:

a step of detecting an auxiliary dot sequence indicating a track of the inclined pattern by using a signal waveform to be obtained from the inspection object pattern image;

a step of calculating, based on the detected auxiliary dot sequence, an approximate curve of the track of the inclined pattern or a tangent line in a predetermined zone of said auxiliary dot sequence;

a step of detecting a signal waveform in a direction perpendicular to the calculated approximate curve of the track of the inclined pattern or the calculated tangent line in the predetermined zone of said auxiliary dot sequence;

a step of measuring dimensions of the inclined pattern by specifying a pattern edge position of the inclined pattern based on the signal waveform in the direction perpendicular to the detected approximate curve or the tangent line;

calculating an angle of inclination of the approximate curve or the tangent line with respect to a vertical direction or a horizontal direction of the inspection object pattern image; and calculating, based on the inclination angle calculated, the signal waveform in the perpendicular direction; and wherein said step of detecting a signal waveform in the perpendicular direction includes:

performing detection while causing the inspection object pattern image to rotate by a degree corresponding to the calculated inclination angle, thereby detecting the signal waveform in the perpendicular direction.

5. A pattern dimension measurement method for measuring dimensions of a pattern inclined relative to a pattern image of an inspection object, said method being performed by an image processing control unit programmed to perform steps comprising:

a step of detecting an auxiliary dot sequence indicating a track of the inclined pattern by using a signal waveform to be obtained from the inspection object pattern image;

a step of calculating, based on the detected auxiliary dot sequence, an approximate curve of the track of the inclined pattern or a tangent line in a predetermined zone of said auxiliary dot sequence;

a step of detecting a signal waveform in a direction perpendicular to the calculated approximate curve of the track of the inclined pattern or the calculated tangent line in the predetermined zone of said auxiliary dot sequence; and a step of measuring dimensions of the inclined pattern by specifying a pattern edge position of the inclined pattern based on the signal waveform in the direction perpendicular to the detected approximate curve or the tangent line;

wherein said step of measuring dimensions of the inclined pattern includes:

independently searching respective ones of right and left pattern edge positions with a center position of the signal waveform in the perpendicular direction being as a reference; and based on the pattern edge positions obtained, measuring dimensions of the inclined pattern.

6. A pattern dimension measurement method for measuring dimensions of a pattern inclined relative to a pattern image of an inspection object, said method being performed by an image processing control unit programmed to perform steps comprising:

a step of detecting an auxiliary dot sequence indicating a track of the inclined pattern by using a signal waveform to be obtained from the inspection object pattern image;

a step of calculating, based on the detected auxiliary dot sequence, an approximate curve of the track of the inclined pattern or a tangent line in a predetermined zone of said auxiliary dot sequence;

a step of detecting a signal waveform in a direction perpendicular to the calculated approximate curve of the track of the inclined pattern or the calculated tangent line in the predetermined zone of said auxiliary dot sequence; and a step of measuring dimensions of the inclined pattern by specifying a pattern edge position of the inclined pattern based on the signal waveform in the direction perpendicular to the detected approximate curve or the tangent line;

wherein the inclined pattern is a straight line pattern slanted with respect to the inspection object pattern image, at the step of calculating an approximate curve of the track of the inclined pattern or a tangent line in a predetermined zone of the auxiliary dot sequence, calculation is performed to determine an approximate curve of the track of the inclined pattern, at the step of detecting a signal waveform in the perpendicular direction, detection is performed to find a signal waveform in the perpendicular direction relative to the calculated approximate curve of the track of the inclined pattern, and at the step of measuring dimensions of the inclined pattern, an operation is performed to specify, based on the detected signal waveform in the perpendicular direction relative to the approximate curve, a pattern edge position of the inclined pattern, thereby measuring dimensions of said inclined pattern.

7. The pattern dimension measurement method according to claim 6, further comprising:

a step of displaying on a screen the inspection object pattern image with the auxiliary dot sequence or the approximate straight line being displayed and a measurement result of the inclined pattern thus measured.

8. The pattern dimension measurement method according to claim 7, wherein the measurement result is any one or a plurality of ones as selected from the group essentially consisting of an average value of pattern dimension values within a measurement range of the inspection object pattern image, a dispersive value of pattern dimension values, a maximal value of pattern dimension values, a minimal value of pattern dimension values, an inclination angle defined between the approximate curve and a vertical direction or a horizontal direction of the inspection object pattern image, and a multiple correlation coefficient indicating a fitting degree of the approximate curve with respect to the auxiliary dot sequence.

9. A pattern dimension measurement method for measuring dimensions of a pattern inclined relative to a pattern image of an inspection object, said method being performed by an image processing control unit programmed to perform steps comprising:

a step of detecting an auxiliary dot sequence indicating a track of the inclined pattern by using a signal waveform to be obtained from the inspection object pattern image;

a step of calculating, based on the detected auxiliary dot sequence, an approximate curve of the track of the inclined pattern or a tangent line in a predetermined zone of said auxiliary dot sequence;

a step of detecting a signal waveform in a direction perpendicular to the calculated approximate curve of the track of the inclined pattern or the calculated tangent line in the predetermined zone of said auxiliary dot sequence;

a step of measuring dimensions of the inclined pattern by specifying a pattern edge position of the inclined pattern based on the signal waveform in the direction perpendicular to the detected approximate curve or the tangent line; and wherein the inclined pattern is a curved line pattern, at the step of calculating an approximate curve of the track of the inclined pattern or a tangent line in a predetermined zone of the auxiliary dot sequence, calculation is performed to determine a tangent line in the predetermined zone of said auxiliary dot sequence, at the step of detecting a signal waveform in the perpendicular direction, detection is performed to find a signal waveform in the direction perpendicular to the calculated tangent line in the predetermined zone of the auxiliary dot sequence, and at the step of measuring dimensions of the inclined pattern, an operation is performed to specify, based on the detected signal waveform in the perpendicular direction relative to the tangent line, a pattern edge position of the inclined pattern to thereby measure dimensions of said inclined pattern.

10. The pattern dimension measurement method according to claim 9, wherein calculation of a tangent line in the predetermined zone of the auxiliary dot sequence is executed by applying function approximation to the predetermined zone of said auxiliary dot sequence.

11. The pattern dimension measurement method according to claim 9, further comprising:

a step of displaying on a screen the inspection object pattern image with the auxiliary dot sequence or the tangent line being displayed and a measurement result of the inclined pattern thus measured.

12. The pattern dimension measurement method according to claim 11, wherein the measurement result is any one or a plurality of ones as selected from the group consisting essentially of an average value of pattern dimension values within a measurement range of the inspection object pattern image, a dispersive value of pattern dimension values, a maximal value of pattern dimension values, a minimal value of pattern dimension values, a maximum inclination angle defined between the tangent line and a vertical direction or a horizontal direction of the inspection object pattern image, a minimum inclination angle defined between the tangent line and the vertical direction or the horizontal direction of the inspection object pattern image, and a multiple correlation coefficient indicating a fitting degree of the tangent line with respect to the auxiliary dot sequence.

13. A pattern dimension measurement device for measuring dimensions of a pattern inclined relative to a pattern image of an inspection object, said device comprising:

electron beam irradiation means for irradiating an electron beam onto the inspection object;

detection means for detecting reflection electrons and secondary electrons to be released from the inspection object due to beam irradiation by said electron beam irradiation means; and image processing means for making an inspection object pattern image based on a signal of the reflection electrons and secondary electrons detected by said detection means, for using a signal waveform obtained from the inspection object pattern image to detect an auxiliary dot sequence indicating a track of the inclined pattern, for calculating based on the detected auxiliary dot sequence an approximate curve of the track of the inclined pattern or a tangent line within a predetermined zone of the auxiliary dot sequence, for detecting a signal waveform in a direction perpendicular to the calculated approximate curve of the track of the inclined pattern or the calculated tangent line within the predetermined zone of the auxiliary dot sequence, for specifying a pattern edge position of the inclined pattern based on the detected signal waveform in the perpendicular direction relative to the approximate curve or the tangent line, and for measuring dimensions of the inclined pattern;

wherein said image processing means comprises:

auxiliary dot sequence detection means for detecting an auxiliary dot sequence indicating a track of the inclined pattern by using a signal waveform of the inspection object pattern image;

approximate-curve/tangent-line calculation means for calculating, based on the auxiliary dot sequence detected by said auxiliary dot sequence detection means, an approximate curve of the track of the inclined pattern or a tangent line in a predetermined zone of the auxiliary dot sequence;

signal waveform acquisition means for detecting a signal waveform in a direction perpendicular to the approximate curve of the track of the inclined pattern as detected by said approximate-curve/tangent-line calculation means or the calculated tangent line in the predetermined zone of the auxiliary dot sequence;

edge detection means for specifying a pattern edge position of the inclined pattern based on the signal waveform in the perpendicular direction relative to the approximate curve or the tangent line as detected by said signal waveform acquisition means; and size measurement means for measuring size of the inclined pattern based on data of the pattern edge position specified by said edge detection means.

14. A pattern dimension measurement device for measuring dimensions of a pattern inclined relative to a pattern image of an inspection object, said device comprising:

electron beam irradiation means for irradiating an electron beam onto the inspection object;

detection means for detecting reflection electrons and secondary electrons to be released from the inspection object due to beam irradiation by said electron beam irradiation means; and image processing means for making an inspection object pattern image based on a signal of the reflection electrons and secondary electrons detected by said detection means, for using a signal waveform obtained from the inspection object pattern image to detect an auxiliary dot sequence indicating a track of the inclined pattern, for calculating based on the detected auxiliary dot sequence an approximate curve of the track of the inclined pattern or a tangent line within a predetermined zone of the auxiliary dot sequence, for detecting a signal waveform in a direction perpendicular to the calculated approximate curve of the track of the inclined pattern or the calculated tangent line within the predetermined zone of the auxiliary dot sequence, for specifying a pattern edge position of the inclined pattern based on the detected signal waveform in the perpendicular direction relative to the approximate curve or the tangent line, and for measuring dimensions of the inclined pattern;

further comprising:

display means for displaying the inspection object pattern image obtained by said image processing means and a size measurement result of the inclined pattern.

15. The pattern dimension measurement device according to claim 14, wherein said display means displays, as the size measurement result of the pattern inclined relative to the inspection object, any one or a plurality of ones as selected from the group consisting essentially of an average value of pattern dimension values within a measurement range of the inspection object pattern image, a dispersive value of pattern dimension values, a maximal value of pattern dimension values, a minimal value of pattern dimension values, an inclination angle defined between the approximate curve and a vertical direction or a horizontal direction of the inspection object pattern image, and a multiple correlation coefficient indicating a fitting degree of the approximate curve with respect to the auxiliary dot sequence.

16. The pattern dimension measurement device according to claim 14, wherein said display means displays any one or a plurality of ones as selected from the group consisting essentially of an average value of pattern dimension values within a measurement range of the inspection object pattern image, a dispersive value of pattern dimension values, a maximal value of pattern dimension values, a minimal value of pattern dimension values, a maximum inclination angle defined between the tangent line and a vertical direction or a horizontal direction of the inspection object pattern image, a minimum inclination angle defined between the tangent line and the vertical direction or the horizontal direction of the inspection object pattern image, and a multiple correlation coefficient indicating a fitting degree of the tangent line with respect to the auxiliary dot sequence.

17. A non-transitory computer readable medium encoded with a computer program for causing a computer to execute a pattern dimension measurement method for measuring dimensions of a pattern inclined relative to a pattern image of an inspection object, wherein the program causes the computer to execute:

a step of causing an auxiliary dot sequence detection unit to detect an auxiliary dot sequence indicating a track of an inclined pattern by using a signal waveform obtainable from the inspection object pattern image obtained by an image acquisition unit;

a step of causing an approximate-line/tangent-line calculation unit to calculate an approximate curve of the track of the inclined pattern or a tangent line within a predetermined zone of the auxiliary dot sequence based on the auxiliary dot sequence detected;

a step of causing a size measurement unit to detect a signal waveform in a direction perpendicular to the calculated approximate curve of the track of the inclined pattern or the calculated tangent line in the predetermined zone of the auxiliary dot sequence;

a step of causing an edge detection unit to specify a pattern edge position of the inclined pattern based on the detected signal waveform in the direction perpendicular to the approximate curve or the tangent line to thereby measure dimensions of said inclined pattern;

a step of calculating an angle of inclination of the approximate curve or the tangent line with respect to a vertical direction or a horizontal direction of the inspection object pattern image; and a step of calculating, based on the inclination angle calculated, the signal waveform in the perpendicular direction;

wherein said step of detecting a signal waveform in the perpendicular direction includes:

performing detection in a direction rotated by a degree corresponding to the calculated inclination angle, thereby detecting the signal waveform in the perpendicular direction.

* * * * *